(12) United States Patent
Yogev et al.

(10) Patent No.: US 8,259,498 B2
(45) Date of Patent: Sep. 4, 2012

(54) CONTINUOUS ADDRESS SPACE IN NON-VOLATILE-MEMORIES (NVM) USING EFFICIENT MANAGEMENT METHODS FOR ARRAY DEFICIENCIES

(75) Inventors: Yoav Yogev, Mazkeret Batya (IL); Amir Gabai, Modiin (IL); Eli Lusky, Tel Aviv (IL)

(73) Assignee: Infinite Memory Ltd., Rosh Haayin (IL)

( * ) Notice: Subject to any disclaimer, the term of this patent is extended or adjusted under 35 U.S.C. 154(b) by 524 days.

(21) Appl. No.: 12/419,837

(22) Filed: Apr. 7, 2009

(65) Prior Publication Data

US 2010/0142275 A1 Jun. 10, 2010

Related U.S. Application Data

(63) Continuation-in-part of application No. 12/330,116, filed on Dec. 8, 2008.

(51) Int. Cl.
*G11C 16/06* (2006.01)

(52) U.S. Cl. ............ 365/185.09; 365/185.2; 365/185.11
(58) Field of Classification Search .................. 711/103; 714/710, 723; 365/185.09, 185.11, 200, 365/185.2
See application file for complete search history.

(56) References Cited

U.S. PATENT DOCUMENTS

| 7,190,617 | B1 * | 3/2007 | Harari et al. | 365/185.11 |
| 7,397,713 | B2 * | 7/2008 | Harari et al. | 365/200 |
| 7,464,306 | B1 * | 12/2008 | Furuhjelm et al. | 714/710 |
| 7,778,077 | B2 * | 8/2010 | Gorobets et al. | 365/185.09 |
| 7,925,939 | B2 * | 4/2011 | Hung et al. | 714/723 |

* cited by examiner

*Primary Examiner* — Gene Auduong
(74) *Attorney, Agent, or Firm* — Vladimir Sherman; Professional Patent Solutions

(57) ABSTRACT

The invention provides a method of managing bad block in a data storage device having an OTP memory die in order to present a continues address space toward the user, by using some of the OTP memory space for the management and maintaining address replacement table. Fast and efficient programming and reading algorithms are presented.

23 Claims, 26 Drawing Sheets

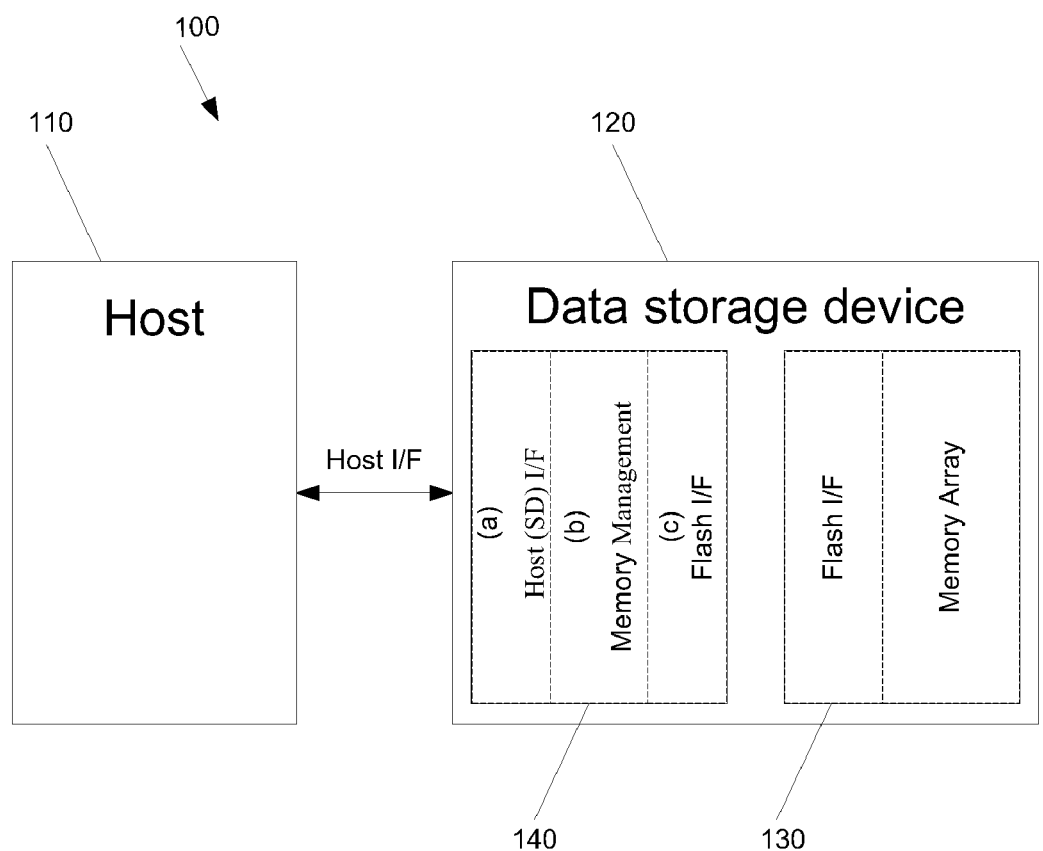
Fig. 1a (art)

CONTINUOUS ADDRESS SPACE IN NON-VOLATILE-MEMORIES (NVM) USING EFFICIENT MANAGEMENT METHODS FOR ARRAY DEFICIENCIES

CROSS-REFERENCE TO RELATED APPLICATION

The present application is a continuation-in-part of and claims the benefit of co-pending, commonly assigned U.S. patent application Ser. No. 12/330,116, filed Dec. 8, 2008, incorporated herein by reference in its entirety.

FIELD OF THE INVENTION

The present invention relates to Non-Volatile-Memory (NVM) devices and to methods of using said device, particularly to a methods of managing array deficiencies.

BACKGROUND OF THE INVENTION

Non-Volatile-Memories (NVM) are extensively used in various portable applications, including mobile phones, music and video players, games, toys and other applications.

FIG. 1a depicts one such exemplary application of NVM, namely a removable storage device such as a SD card. However, the current invention is not limited to this specific use.

FIG. 1a depicts a system 100 comprising a host 110 and a data storage device 120 as known in the art. Data storage devices such as SD cards, USB sticks or other storage devices usually integrate NVM 130 and a controller 140 into a single package 120.

When connected to a host device 110, for example a personal or a laptop computer, communication between the data storage card and the host device commence. The controller 140 within the data storage device 120 manages data transfer between the host and the NVM 130 by serving as a gateway in both data transfer directions by writing to and reading from NVM 130. The data consists of user data and management data and files. Management files comprising addresses updates and files naming. The operating system that enables the communication between the host and the data storage device is DOS (Disk Operating System) based.

As known in the art, Host 110 may request to read information from data storage device 120. Host 110 is fitted with operating system capable of accessing external storage devices. It generally consists of Master Boot Record (MBR); Partition Boot Record (PBR); Folders information; and File Allocation Table (FAT). The MBR consist information regarding the data storage device including FAT location and size; and root directory location. Its location is always logic address 0 which is translated by the controller to a physical address in the memory die. Root directory is with constant table size, consisting 512 rows, each with a description of the files or folders existing in the disk. It includes name, size, first block location and type of file (file or directory).

Upon power-up, when connecting the memory card to the host or per user request to access the memory card, the MBR is addressed, the host generates a copy of the FAT in its memory and approaches to the root directory where information regarding the files is extracted (either located in the root folder itself, or more typically in a subfolder associated with the folder which appears in the root directory). Once the location of the first block of the requested file is identified, the rest of the blocks are sequentially pointed by the FAT. The FAT is owned by the controller and it uses logic addresses—the translation of the logic addresses to physical addresses is done by the controller that allocates both the data and the FAT in specific physical locations within the memory array.

In prior art, the controller manages the data access to the NVM die by page chunks, with size ranging between 512 B to 4 KB where NAND flash type memory is commonly used as the NVM incorporated in data storage devices. Typically to NAND flash memories, the array is not fully functional and some of the pages are defected and malfunction. As each page is characterized by unique address, the indexes associated with the defected pages are being kept in a dedicated area of the memory array. On power-up, the controller reads the information into its internal memory and uses it to avoid reading or writing to the defected locations.

A variety of controllers are available with different complexity, performance and cost. One of the main features characterizing these controllers is the internal memory capacity that allows handling stored information in the memory array, for example, conversion tables to indicate on the defected pages and their location. For low cost controllers, the internal memory space might be less than the minimum requirement to accommodate the maximum allowed number of bad blocks in typical NAND flash, commonly less than 2% of the memory array.

In methods of the art, in order to support field programming, the information associated with newly occurring defected blocks must be stored in a dedicated area before power-down. In standard NAND flash, this may be realized by writhing and re-writhing to a dedicated region in the memory array. The outcome of the above description is that after a few programming sequences, it may be possible that the loaded data is stored at non-continuous addresses space.

Other types of NVM memories that may be combined with a dedicated controller as a system is NOR flash or alternatively mask ROM (Read Only Memory) OTP (One Time Programmable), featuring perfect die characteristics with no need for bad blocks treatment due to tight production tolerances. In such a case the requirements from the controller are less demanding, as the ability to access a non continuous address space memory is not required.

The limitations that are associated with NOR memories relates to it being costly to produce compare to NAND flash and mask ROM OTP. Mask ROM OTP memories suffer from various deficiencies relating to the lack of field programmability capability, the limited die density, being typically less than 64 MB, and the long turn-around time as the processing time in the fabrication facility is long, typically 4-8 weeks. Furthermore, design to product phase may be long and costly as design errors may result with the need to generate new set of masks.

Other types of OTP memory that overcome the limitations associated with the traditional mask ROM technology are NROM and Matrix technologies. NROM technology for example, features field programmability capability, realizing much higher die density and may compact up to four times more bits per given die area by realizing the four per bit QUAD NROM technology.

In order to be compatible with NOR flash and mask ROM OTP controllers, NAND flash, NROM based memories and other types of memories that allow bad block occurrence, must present a continuous address space to its interface with the controller. Hence, realization of internal management of array deficiencies in NVM die, will relax the demand from the controller die.

U.S. Pat. No. 6,034,891 entitled "Multi-state flash memory defect management" to Norman, Robert discloses a defect management system for use in multi-state flash memory device, which has shift register which maintains input data to be written in defective memory location serially.

U.S. Pat. No. 5,671,229; titled "Flash eeprom system with defect handling"; to Harari, Eliyahou et al. discloses a computer system flash EEPROM memory system with extended life, which uses selective sector erasing, defective cell and sector remapping, and write cache circuit reducing faults.

U.S. Patent Publication No. 2006-0084219 to Lusky et al. entitled "Advanced NROM structure and method of fabrication" discloses a method to enable manufacturing the dual memory NROM memory die.

SUMMARY OF THE INVENTION

The present invention relates to an apparatus, system and method for achieving continues address space in Non-Volatile-Memories (NVM) to support functionality of these memories with simple controllers.

It is an aspect of the invention to allow the use of NROM OTP memory in application where mask ROM technology is used, taking advantage of the low cost, field programming and the high density of NROM OTP die.

It is another aspect of the invention to adopt an NROM based OTP and NAND flash memories to work with continues address space. In the embodiment of the invention, the NVM memory internal logic will manage defected blocks in order for the controller die to work with a continues address space.

The present invention discus methods and structures of using NVM memories in general and One-Time-Programmable (OTP) memory devices in particular. More specifically, the present invention relates to a method of managing bad blocks internally by the memory die rather than the controller die in such a way that the controller will face a continues address space (bypassing memory "holes" due to bad block).

An aspect of the current invention relates to the method of bad block management during programming stage and redirection of the specific bad block address to a good block address that will replace the original block during all future access.

As a non limiting example, the invention discloses a system based on an OTP 4 bit-per-cell NROM array. As the 4 bits-per-cell memory is realized using two separated physically packets of charge located over both the transistor junctions, each charge packet can be modulated to address 4 different logic levels being [0,0]; [0,1]; [1,0]; and [1,1]. The memory cells are manufactured with an initial value stored level of [1,1] and can be programmed only in the following direction [1,1]→[0,1]→[0,0]→[1,0]. Once a bit is programmed to a higher value it cannot be erased to a lower value.

The NROM cell can also be programmed to a 2 bit-per-cell mode where it can store one of the following two values [1] and [0] per each physical bit. The value [1] in 2 bit-per-cell is physically the same as [1,1] of the 4 bit-per-cell mode (which is the native mode) and [0] is physically the same as [1,0] of the 4 bit-per-cell (which is the most programmed mode). Read access to a 2 bit-per-cell mode information will be faster and more reliable than a read access to 4 bit-per-cell information which holds more data per cell.

The access to the data in the NROM OTP array is in a page resolution (typically 512-4K Byte), furthermore, the page can be reprogrammed with the restriction of the program direction mentioned above. Any attempt to program a bit already programmed with a higher value will cause no action on the specific cell.

An exemplary method of this invention is to use some of the data pages in the array as control pages to point to each block in the array. The un-programmed, initial state (all [1]) of all the cells in the pointer will indicate that no redirection of the data block is needed and the original page should be accesses. A value different then the initial value will cause this block to redirect and access to the block address stated in the designated area instead of the defective block.

The controller issues program command to the NVM's user pages as in a continuous address space wherein the logic circuitry manages the bad blocks internally, and redirect them to valid blocks only. When the controller die submits a program command, pages are accessed continuously. In case the program command fail to finish successfully, the logic circuitry of the memory die tags this block as a defective block and use a spare block to finalize the program command; typically all spare blocks are allocated at the end of the array. After programming the user data, the redirection information is updated into a redirection table.

During read access the memory die, the host provide set of addresses to be read with a continuous address space where the logic circuitry addresses the read command to the target page according to the redirection table. Access to the redirection table may result with longer read operation of the die. A remedy to this may be realized by using a Fast Access Memory (FAM) redirection indication table, an additional table to the redirection table. The FAM redirection indication table comprises only an indication if a block is defected or not, and it is allocated in a fast access special memory area. The fast access area may consist of 1 bit per cell and the entries can be sorted by the block address. Under these circumstances, during read operation, the internal array logic searches the redirection information in a short amount of time and therefore reduces the latency of the read operation.

It is an aspect of the current invention to provide a method of programming a non volatile memories having several defective blocks comprising: when encountering a bad block during programming: assigning a replacement block for programming data intended to be programmed in said bad block; and presenting continues address space by embedded memory logic management.

In some embodiments, the method further comprising: updating a counter with the number of bad blocks when encountering a bad block during programming.

In some embodiments, updating a counter comprises updating at least one bit in a non volatile memory.

In some embodiments, updating a counter comprises updating a single bit in a non volatile In some embodiments, updating counter bits is conducted in a sequential order from LSB to MSB.

In some embodiments, the step of replacement block for programming data intended to be programmed in said bad block comprises: reading from said counter data indicative of number of bad blocks; assigning a replacement block by counting the number of blocks from the end of a dedicated region according to the number bad blocks indicated in said counter.

In some embodiments, the method further comprising: updating a redirection table with address of said assigned replacement block.

In some embodiments, updating redirection table comprises changing a single word in said redirection table.

In some embodiments updating a word in said redirection table comprising addressing a word with index equal to bad block address, and updating said word content with the assigned spare redirected block address.

In some embodiments, for a user data memory of 64K blocks or less, said updated word length is 16 bits or more.

In some embodiments, for a user data memory of 128K blocks or less, said updated word length is 17 bits or more.

In some embodiments an un-updated word in said redirection table indicates a user data block that was not assigned a replacement block.

In some embodiments the method further comprising: updating redirection indication table in extended Fast Access Memory (FAM) table, indicating for each user data block logic address with if a replacement block was assigned or not.

In some embodiments the redirection indication table associates a single bit with at least single block in the user's data section.

In some embodiments, bits in redirection indication table are having index indicating the block address, and the bit content indicates if the block is defected or not.

In some embodiments, updating redirection indication table is done by changing a single bit.

In some embodiments the method, assigning alternative spare block comprising: identifying a bad block while attempting and failing to program user data page; programming said user data page in the corresponding page in the assigned spare redirected block; and if said failing page is not the first page in the defected block, copying preceding pages already programmed from the bad block to the assigned spare block.

In some embodiments, copying preceding pages already programmed from the bad block to the assigned spare redirected block comprising: reading data from a page to be copied to logic; and writing the page data to the corresponding page in redirected block.

In some embodiments, the method further comprising: reading data from a page to be copied to logic; loading said page data to data storage controller; verifying data content using ECC; and fixing detected errors if so required; writing data from said storage controller to logic; and writing the page data to the redirected block.

It is an aspect of the current invention to provide a method of programming a non volatile memories having several defective blocks comprising checking logic addresses in redirection indication table to find if the page to be programmed belong to defected block or not.

In some embodiments, if redirection indication table indicates that said logic address is associated with a defective block, a spare block is addressed by a concise redirection table in extend FAM area or alternatively by the redirection table.

In some embodiments, the user data region further comprises a redirection table.

In some embodiments, the code region comprises a redirection table.

In some embodiments, the user data part capable of high density data storage is capable of storing at least two bits per cell.

In some embodiments, the user data part capable of high density data storage is capable of storing at least four bits per cell.

In some embodiments, the spare block region is at least 1% of the total capacity of the user data region In some embodiments, the spare blocks region is located at the last functional address space.

In some embodiments, the size of spare block is determent by the number of bad blocks.

In some embodiments, the code data region has accessibility resolution of single bit.

In some embodiments, the code data region comprising same cell structures as in user data region.

In some embodiments, the code data region comprising of cells capable of storing one bit per cell.

In some embodiments, the code data region comprising of cells capable of storing two bits per cell.

In some embodiments, the code data region comprising cells having at least 50% wider cell structure than the user region cell's width.

In some embodiments, the non-volatile memory is constructed from NROM array.

In some embodiments, the non-volatile memory is constructed from OTP cells.

In some embodiments, the non-volatile memory is constructed from NAND flash cells.

In some embodiments, the device is monolithic.

The extend of which the internal logic owns the overall functions associated with bad block management depends on the kind of controller used; in the most basic form as described in FIGS. 1-10; the controller is with basic functionality and the internal logic is with enhanced capabilities. In another aspect of the current invention we propose a method and a structure to ease the requirements from the internal logic;

In one embodiment, we suggest to use different controllers for the programming sessions to be conducted as a single event during manufacturing process and during read operation to be conducted according to methods disclosed in FIGS. 1-10. The controller to be used during programming may be highly capable where the controller to be used at field application by the end user is to be very simple and cost effective.

In yet another aspect of the current invention, we propose to enable less demanding requirements from the internal logic while the requirements from the controller as become more demanding and yet significantly less complex controller is required in comparison to state of the art NAND flash controllers.

It is an aspect of the current invention to provide a non-volatile memory device capable of automatically handling defective cells and generating continuous address space comprising: a memory array comprising: user data region; and code region comprising: extended Fast Access Memory (FAM) table comprising of redirection indication table; redirection table; counter table; and spare blocks region; and b) a logic circuit for writing and reading from the memory array region; c) programming controller; d) reading controller, alternatively programming and reading controller may be unified It is another aspect of the current invention to provide a method of programming a Non Volatile Memories (NVM) having defective blocks comprising: assigning a replacement redirection block address for programming data intended to be programmed in said bad block; wherein, assigning a replacement redirection block comprising: programming information in concise table within extended Fast Access Memory (FAM) table of the NVM.

In some embodiments, the method further comprising: updating a counter with the number of bad blocks when encountering a bad block during programming.

In some embodiments, updating a counter comprises updating a single bit in a non volatile memory.

In some embodiments, the step of programming information in concise table within extended FAM section of the NVM comprising original and redirection addresses of said redirected blocks.

In some embodiments, the step of programming information in concise table within extended FAM section of the NVM is done after all user's data has been programmed to said NVM.

In some embodiments, the step of programming information in concise table within extended FAM section of the NVM is done after the NVM die is locked.

In some embodiments, the concise table comprising original and redirection addresses of said redirected blocks comprises a table sorted according to original block addresses.

In some embodiments, the concise table comprising multiple entries, wherein a single entry corresponding to at least a single bad block.

In some embodiments, the concise table comprising multiple entries, single entry corresponding to a single bad block.

In some embodiments, the entry in said concise table consist at least 32 bits.

In some embodiments, the entry in said concise table consist 32 bits.

In some embodiments, the concise table consist 34 bits

In some embodiments, the method further comprising: updating redirection indication table in extended Fast Access Memory (FAM) table, indicating for each user data block logic address—if a replacement block was assigned or not.

In some embodiments, the redirection indication table in extended FAM table associates a single bit with at least single block in the user's data section.

In some embodiments, bits in said redirection indication table in extended FAM table are having index indicating the block address, and wherein the bit content indicates if the block has been redirected or not.

In some embodiments, updating redirection indication table in extended FAM table is done by changing a single bit.

In some embodiments, the extended FAM is composed of fast accessed data capable of single bit accessibility.

In some embodiments, the extended FAM is composed of fast accessed data with at least twice shorter word lines.

In some embodiments, the extended FAM is composed of fast accessed data with at least twice the width of cells in data region within NVM array In some embodiments, the method further comprising: a) connecting a NVM die comprising: user data section; extended FAM section; and management logic to a programming board comprising a programming controller; b) programming said NVM die with: data in its user data section; and redirection concise table in its extended FAM section and; redirection indication table in its extended FAM section; c) locking the NVM die; disconnecting said NVM die from said programming board; d) connecting said NVM die to a reading controller having less computing resources than said programming controller; and e) reading user information using said reading controller while presenting a continuous address space.

It is another aspect of the current invention to provide a method of reading user data page using embedded memory logic management in a continuous logical address space NVM, having several defective blocks, comprising: a), searching a concise redirection table located in extended Fast Access Memory (FAM) section for data indicative of actual address of redirected blocks; b) reading the directed block; and c) presenting continues address space to the host device.

In some embodiments, the method further comprising: reading from redirection indication table within extended FAM a data indicative if said logical address is associated with a redirected block; and if redirection indication table within extended FAM indicates that said logical address is associated with a redirected block—searching said concise redirection table data indicative of address of said redirected block.

In some embodiments, the method further comprising: reading indication register and determining if NVM die is locked or not; and if NVM die locked, accessing the concise redirection.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

IN THE DRAWINGS

FIG. 1a depicts a system 100 comprising a host 110 and a Non-Volatile-Memory (NVM) data storage device 120 as known in the art.

Figure 1B:
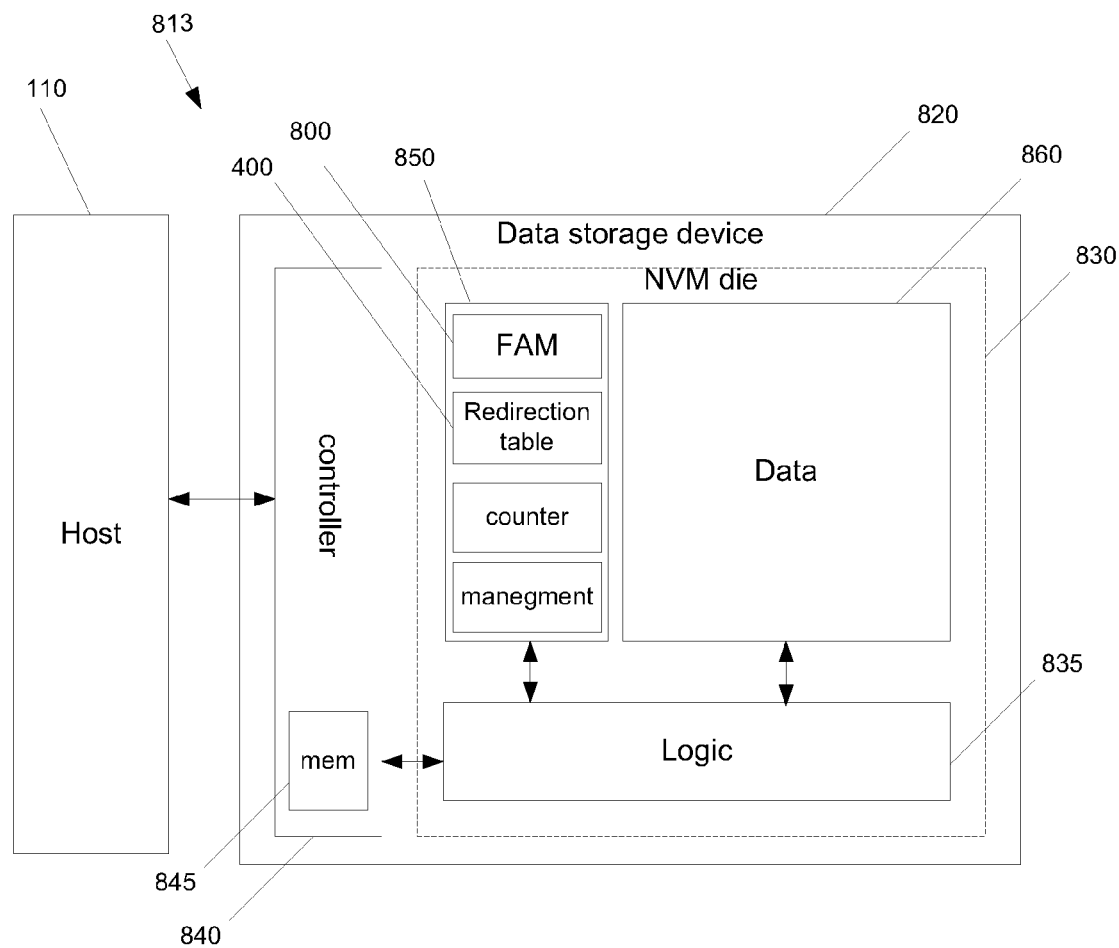

FIG. 1b schematically depicts a system 813 comprising a host 110 connected to a data storage device 820 according to an exemplary embodiment of the current invention.

Figure 2A:
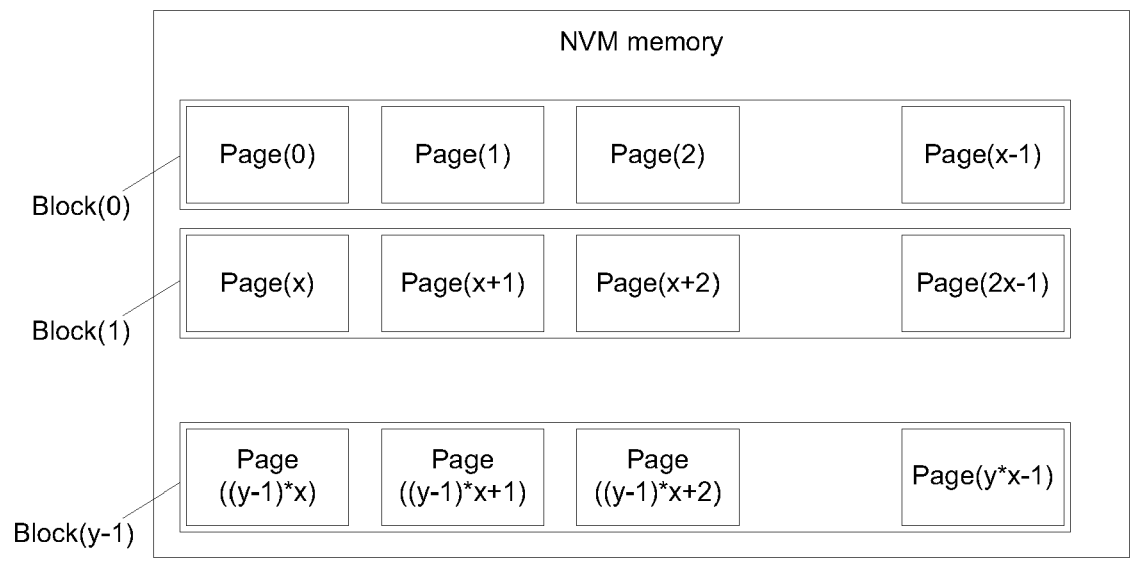

FIG. 2a depicts the physical memory arrangement inside a flash memory, for example the user's data section 860.

Figure 2B:
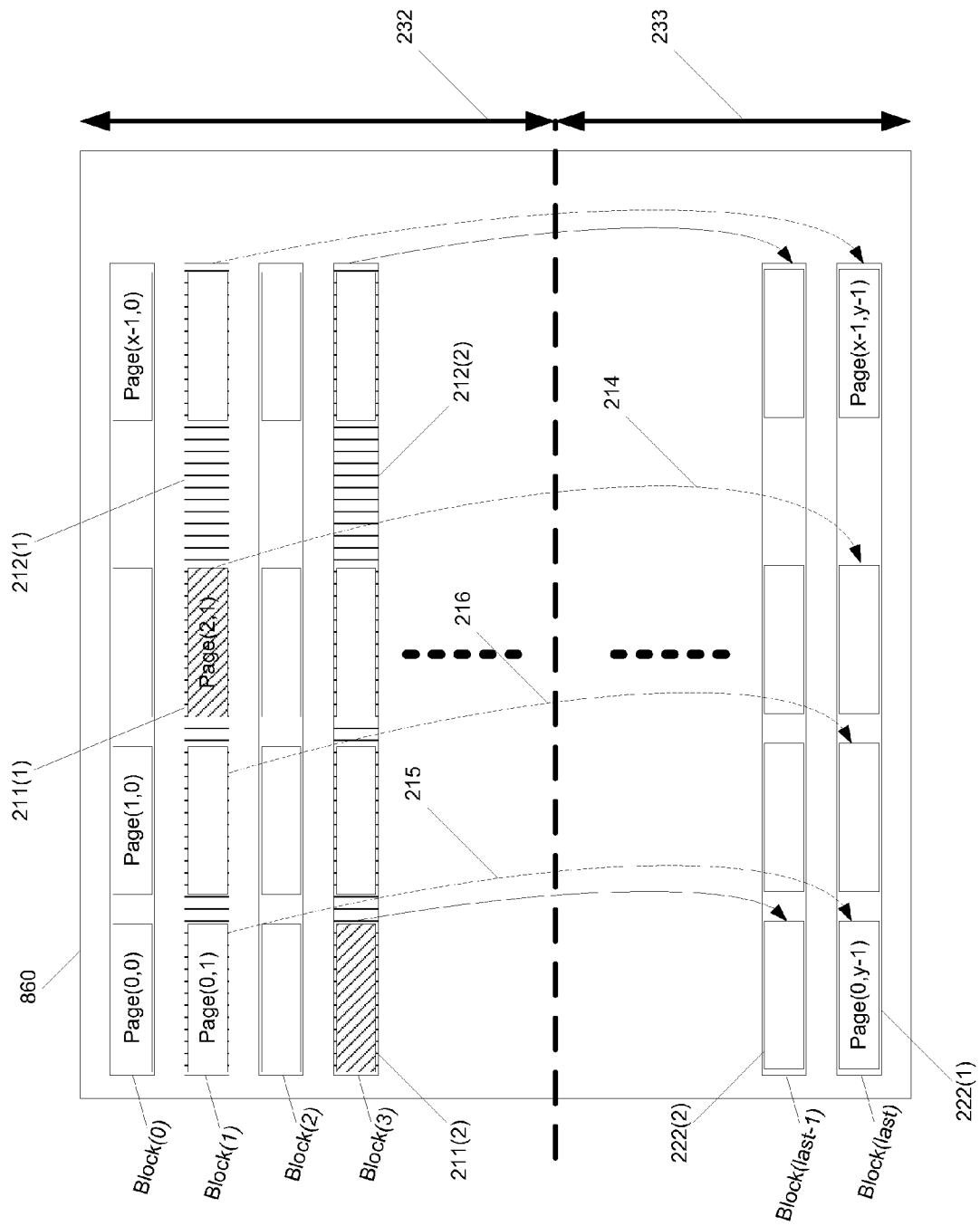

FIG. 2b schematically depicts the process of writing user data into user's data section 860 according to the preferred embodiment of the invention.

Figure 3:
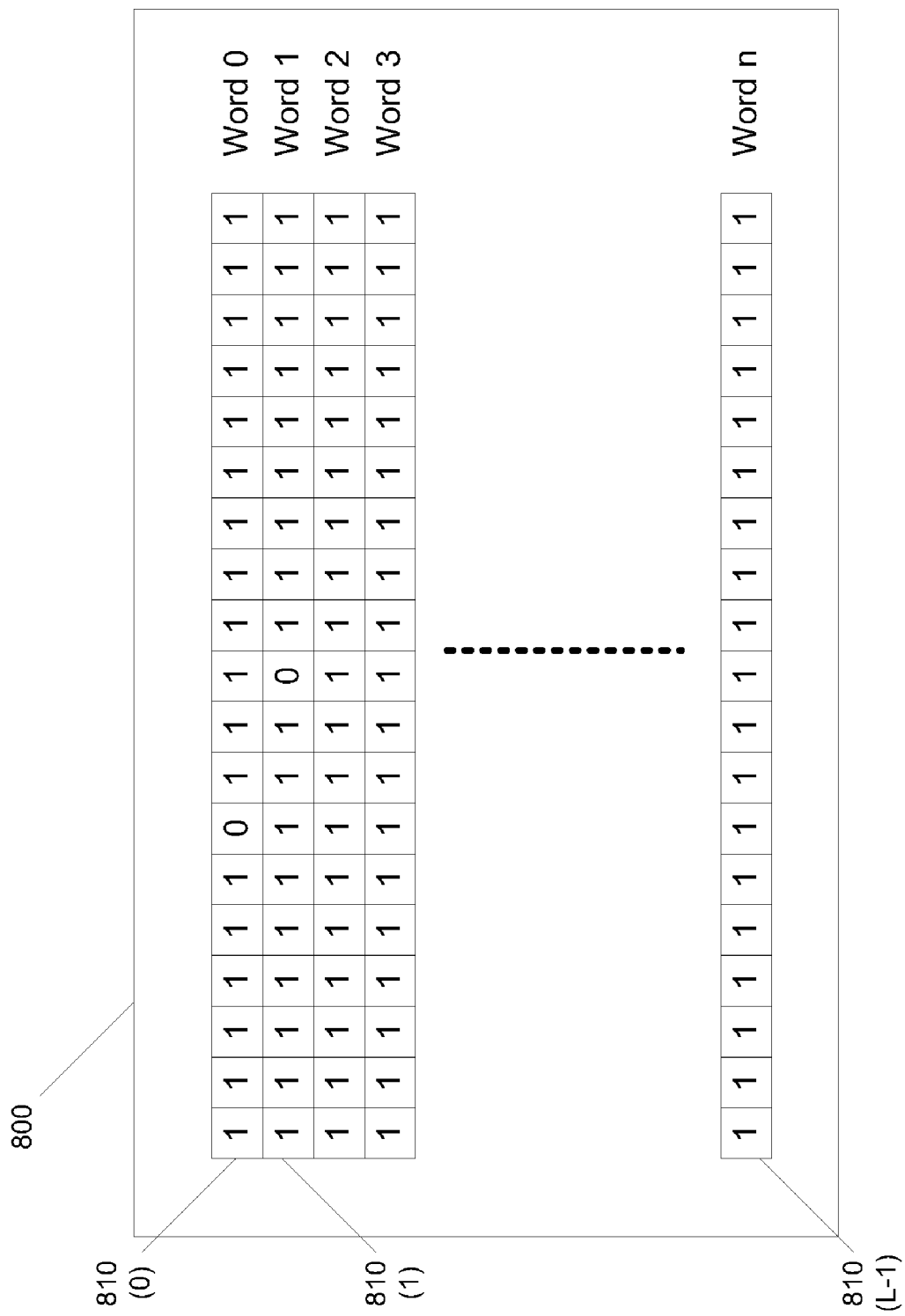
Figure 4:
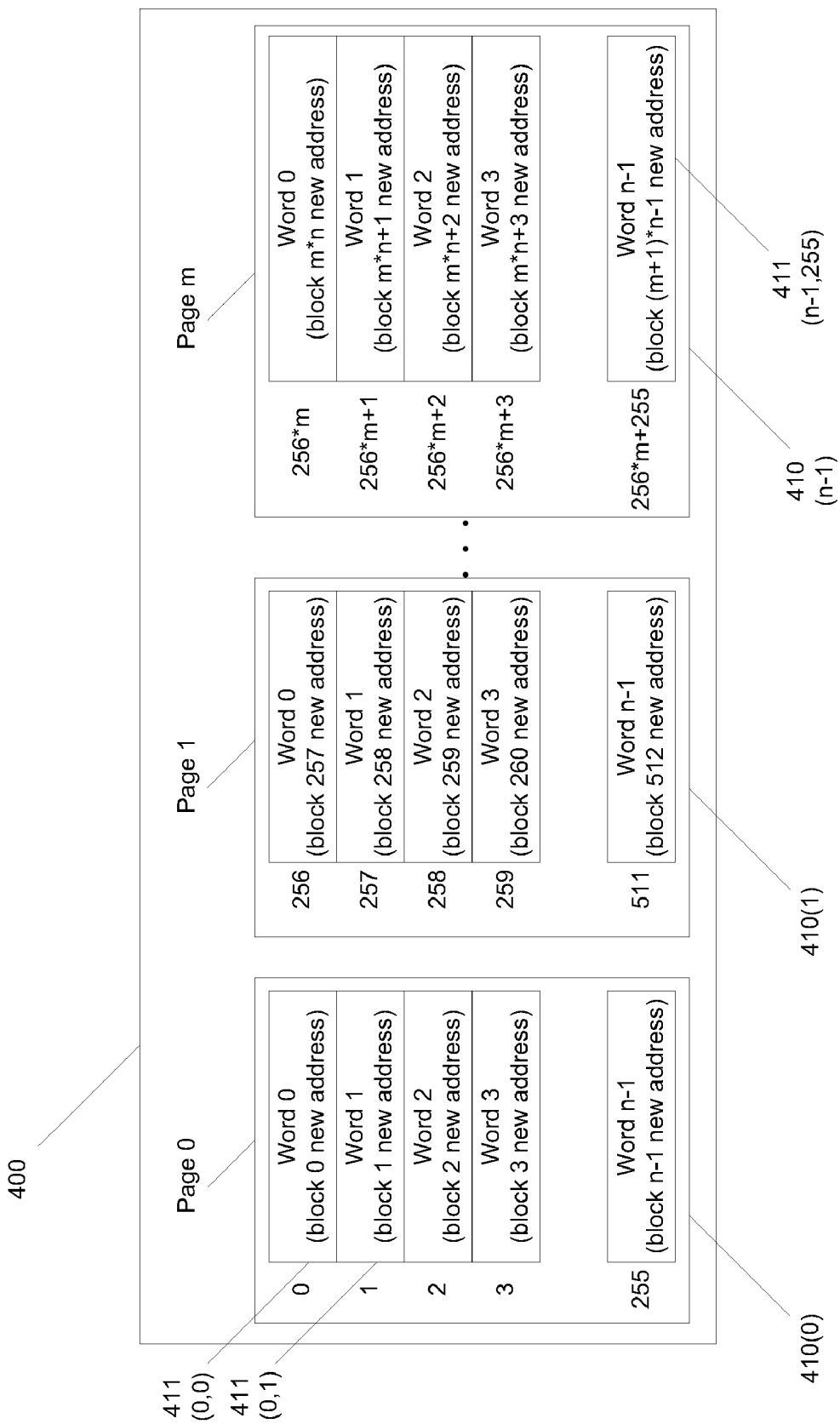

FIG. 3 schematically depicts Fast Access Memory (FAM) redirection indication table 800 used for acceleration of read command according to an exemplary embodiment of the current invention FIG. 4 schematically depicts the data structure of redirection table 400, showing m pages 410(0) to 410(m−1), each page comprising redirection lines 411(0) to 411 (255).

Figure 5:
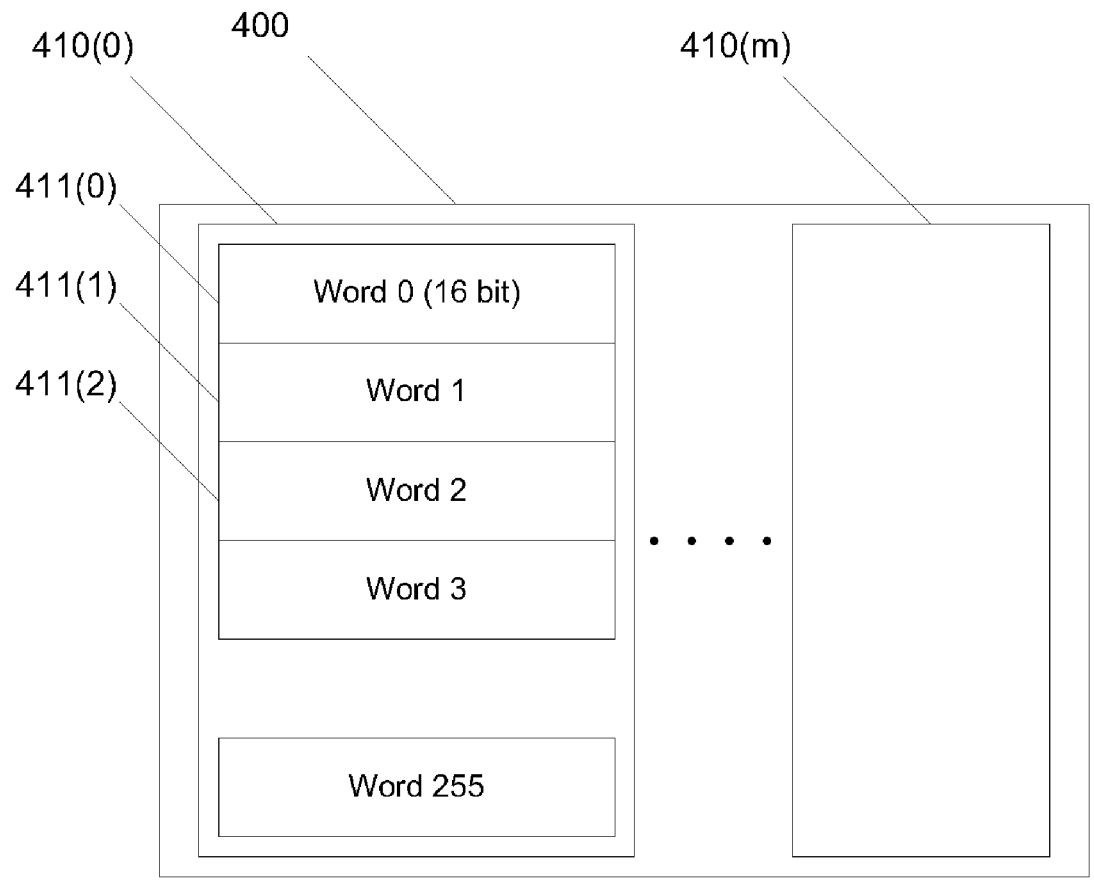

FIG. 5 schematically depicts the data format in a page 410 of the redirection table 400 according to an exemplary embodiment of the current invention.

Figure 6:
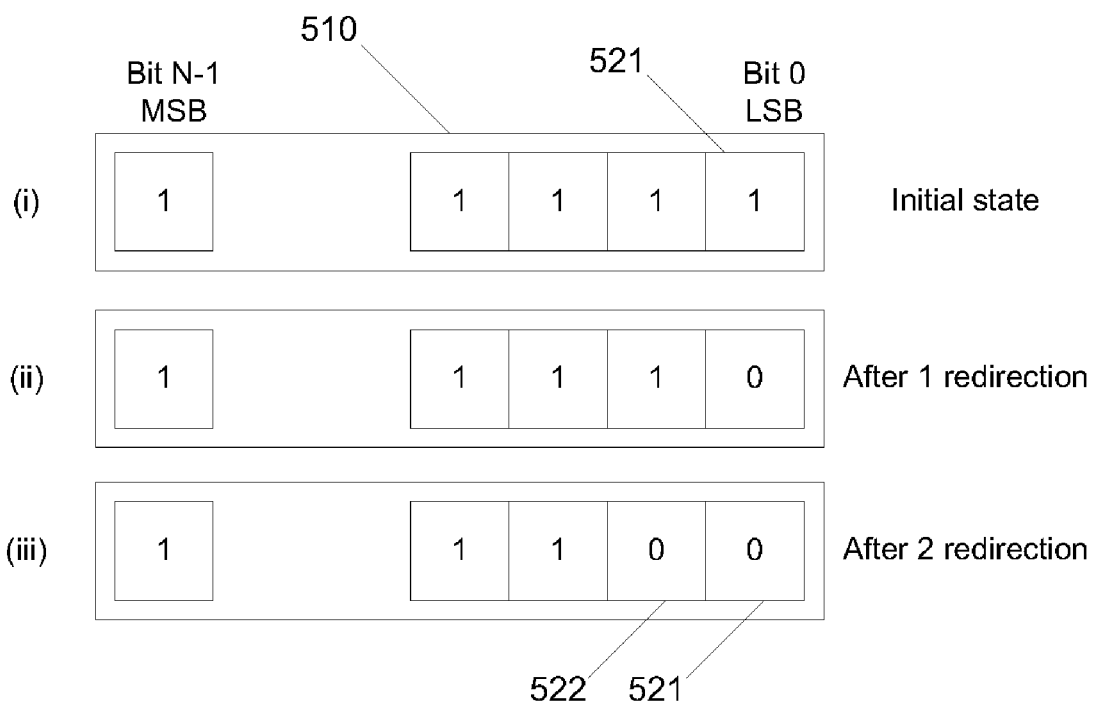

FIG. 6 schematically depicts the use of a counter 510 within code memory section 850 according to an exemplary embodiment of the invention.

Figure 7A:
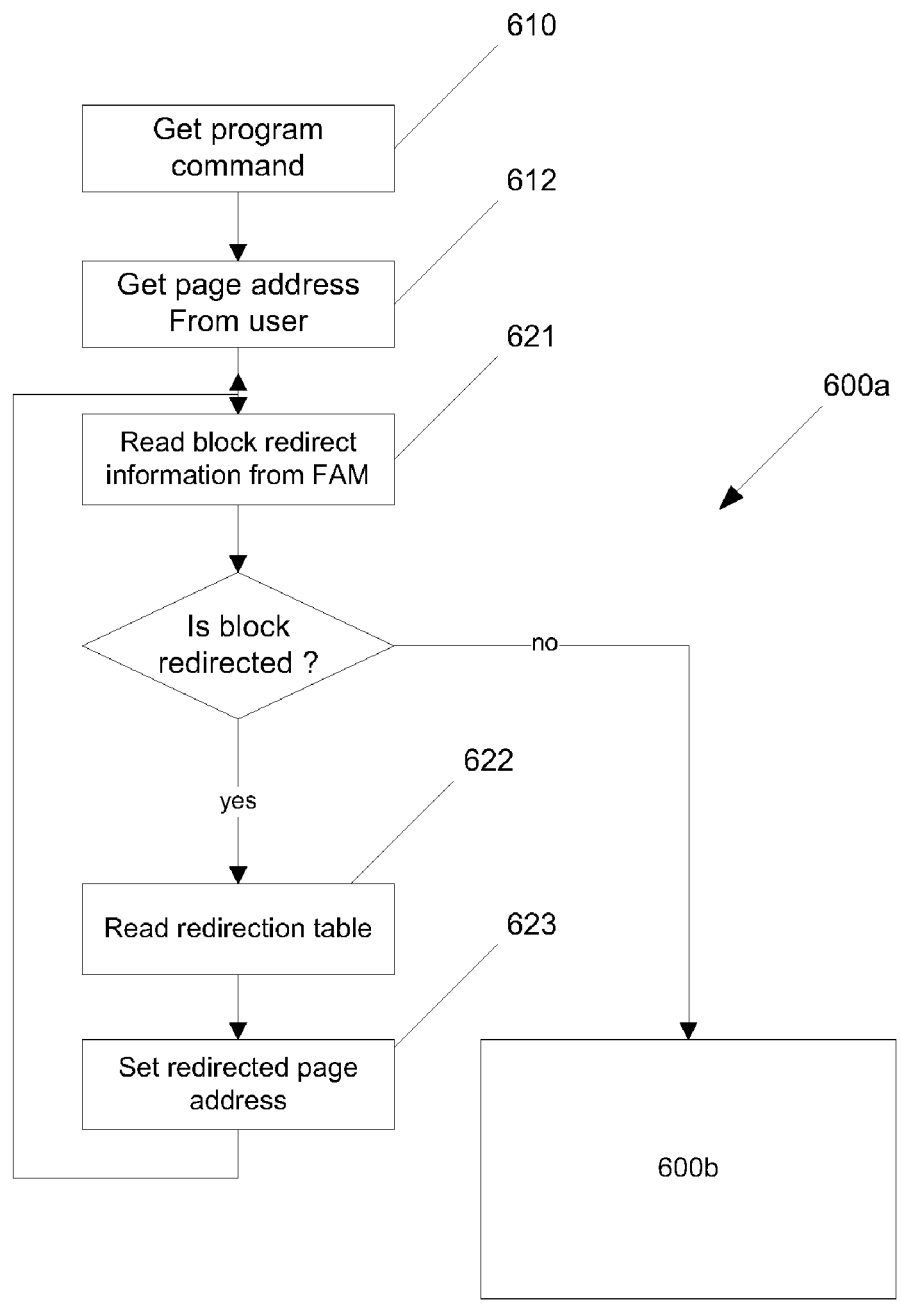

FIG. 7a schematically depicts flow chart 600a of the first stage of algorithm used to write user data page into user's data memory section 860 according to the exemplary method of the current invention.

Figure 7B:
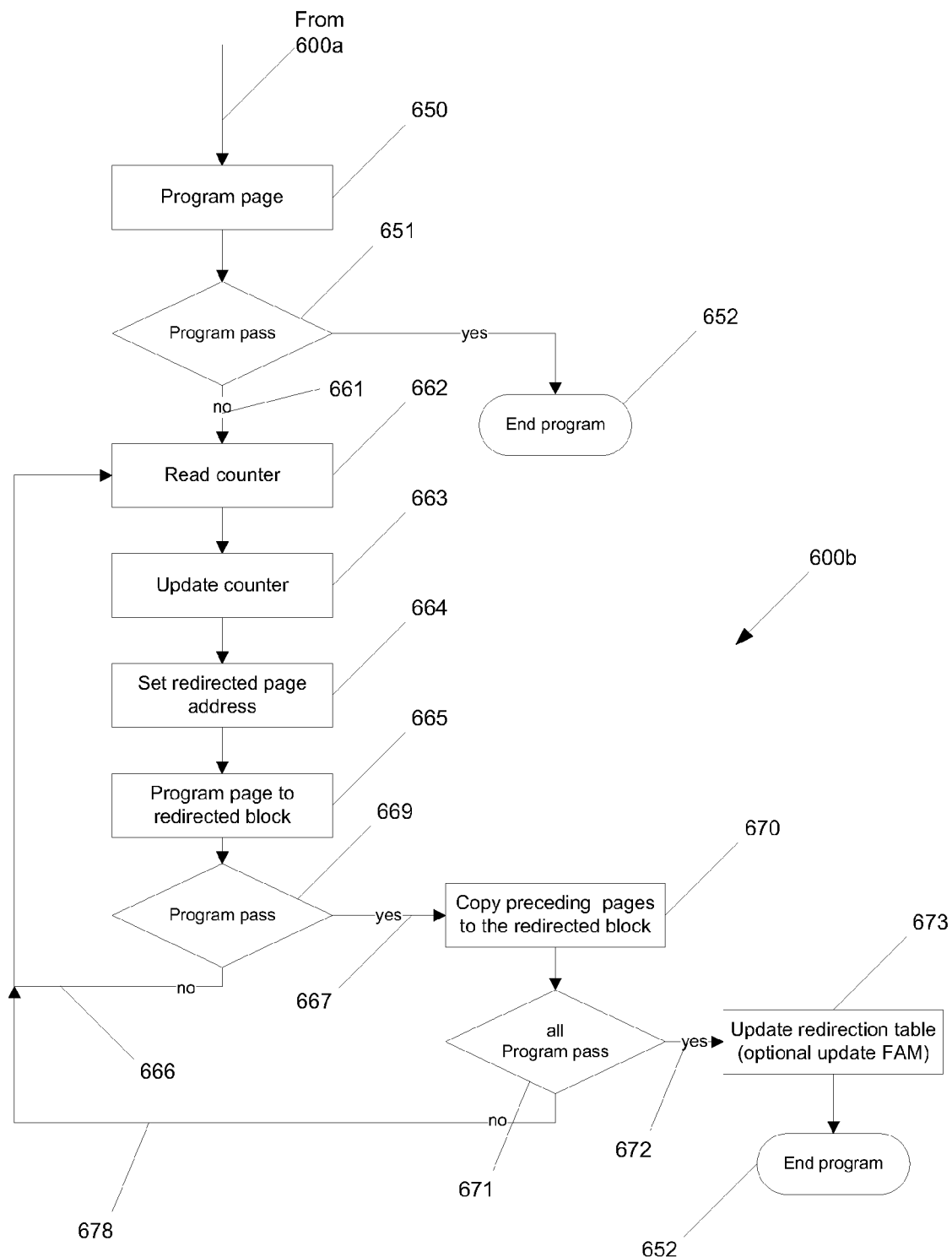

FIG. 7b schematically depicts flow chart 600b of the second stage of algorithm used to write user data page into user's data memory section 860 according to the exemplary method of the current invention.

Figure 8A:
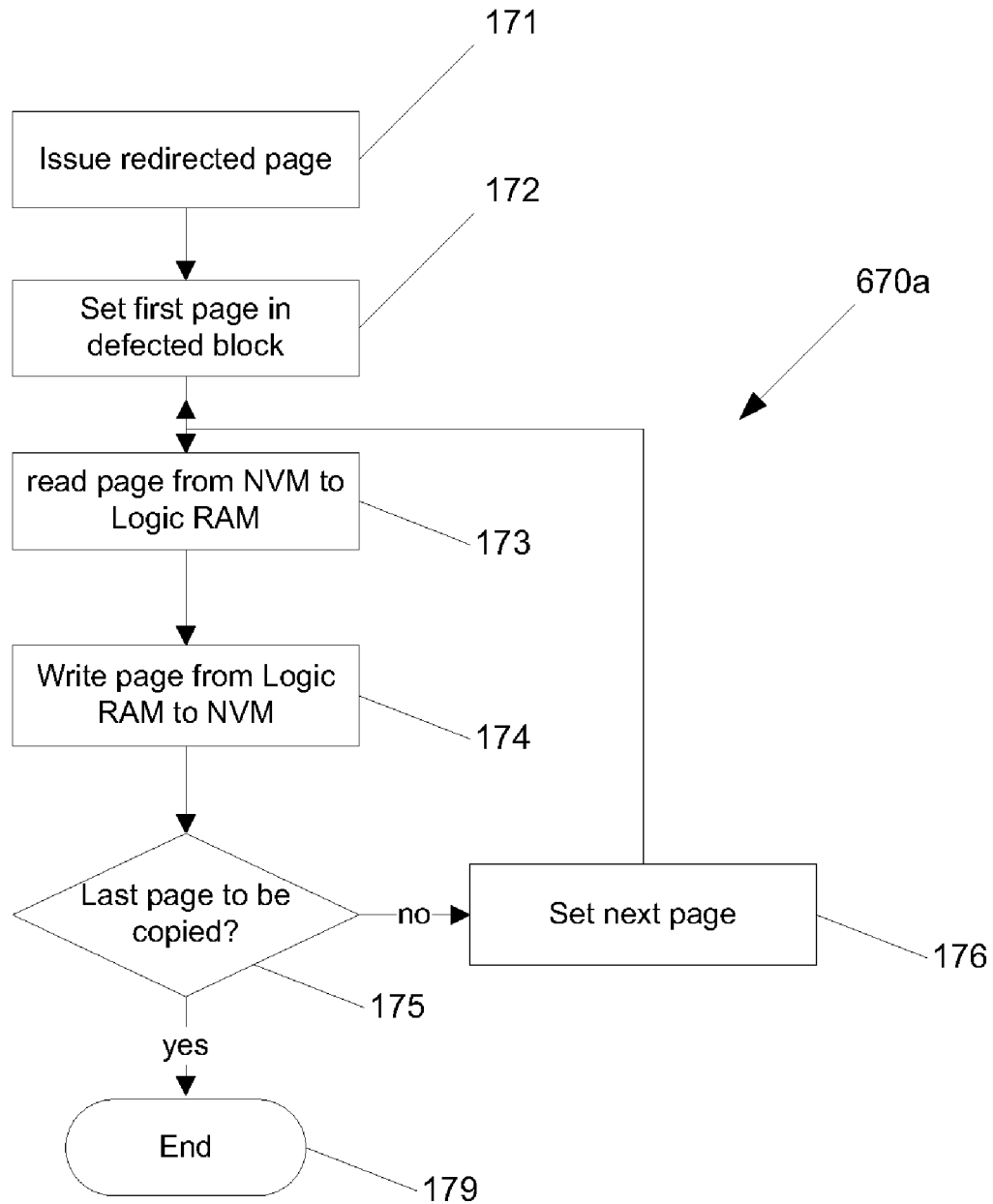

FIG. 8a schematically depicts an algorithm 670a for copying data from pages on a defective block to a redirected (spare) block location according to an exemplary embodiment of the current invention.

Figure 8B:
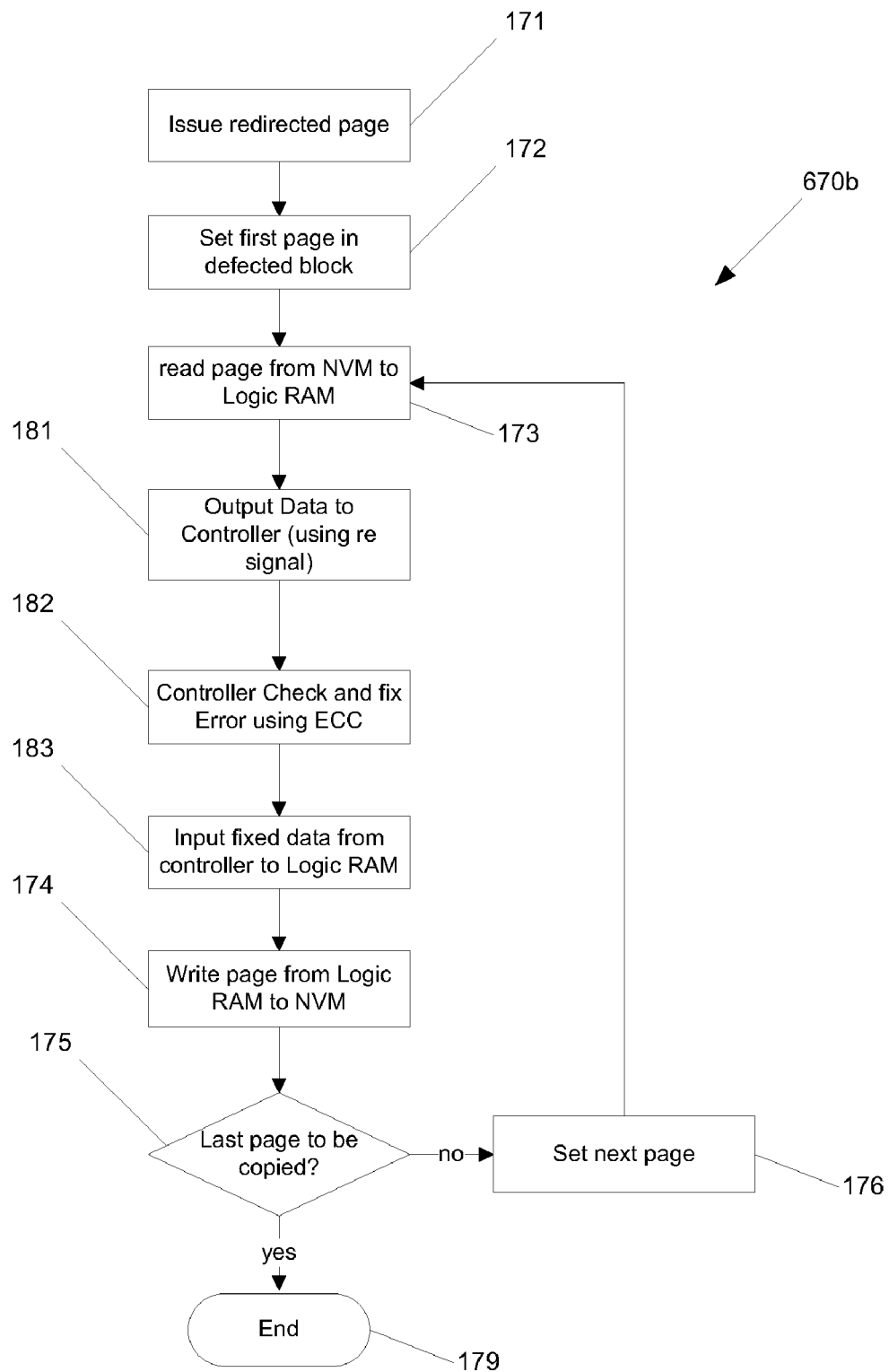

FIG. 8b schematically depicts an algorithm 670b for copying data from pages on a defective block to a redirected block location using ECC according to a preferred exemplary embodiment of the current invention.

Figure 9:
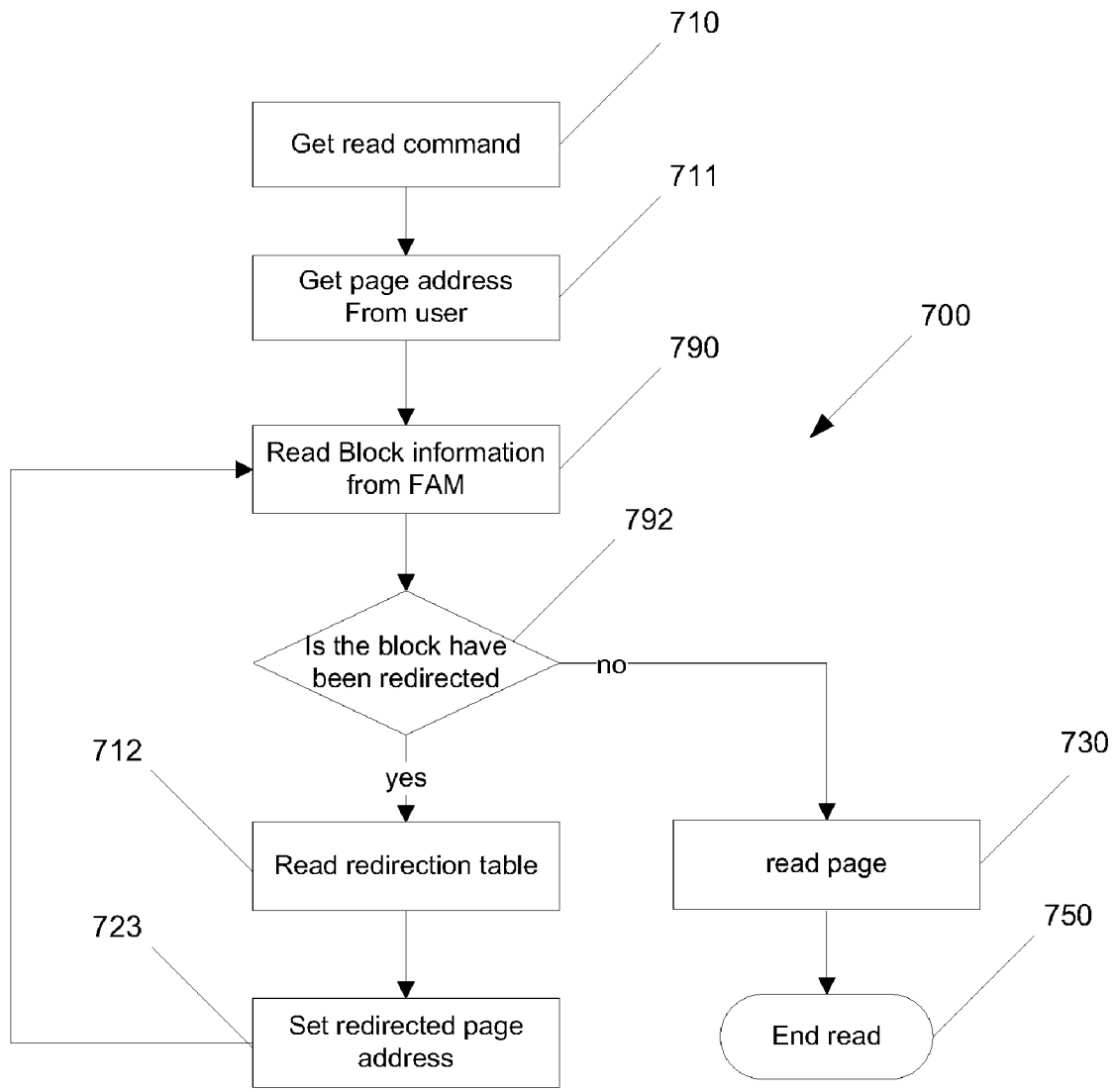

FIG. 9 schematically depicts reading algorithm 700 according to an exemplary embodiment of the current invention of a NVM device such as device 830 which was programmed for example by an algorithm such as disclosed in FIGS. 7a and 7b.

Figure 10:
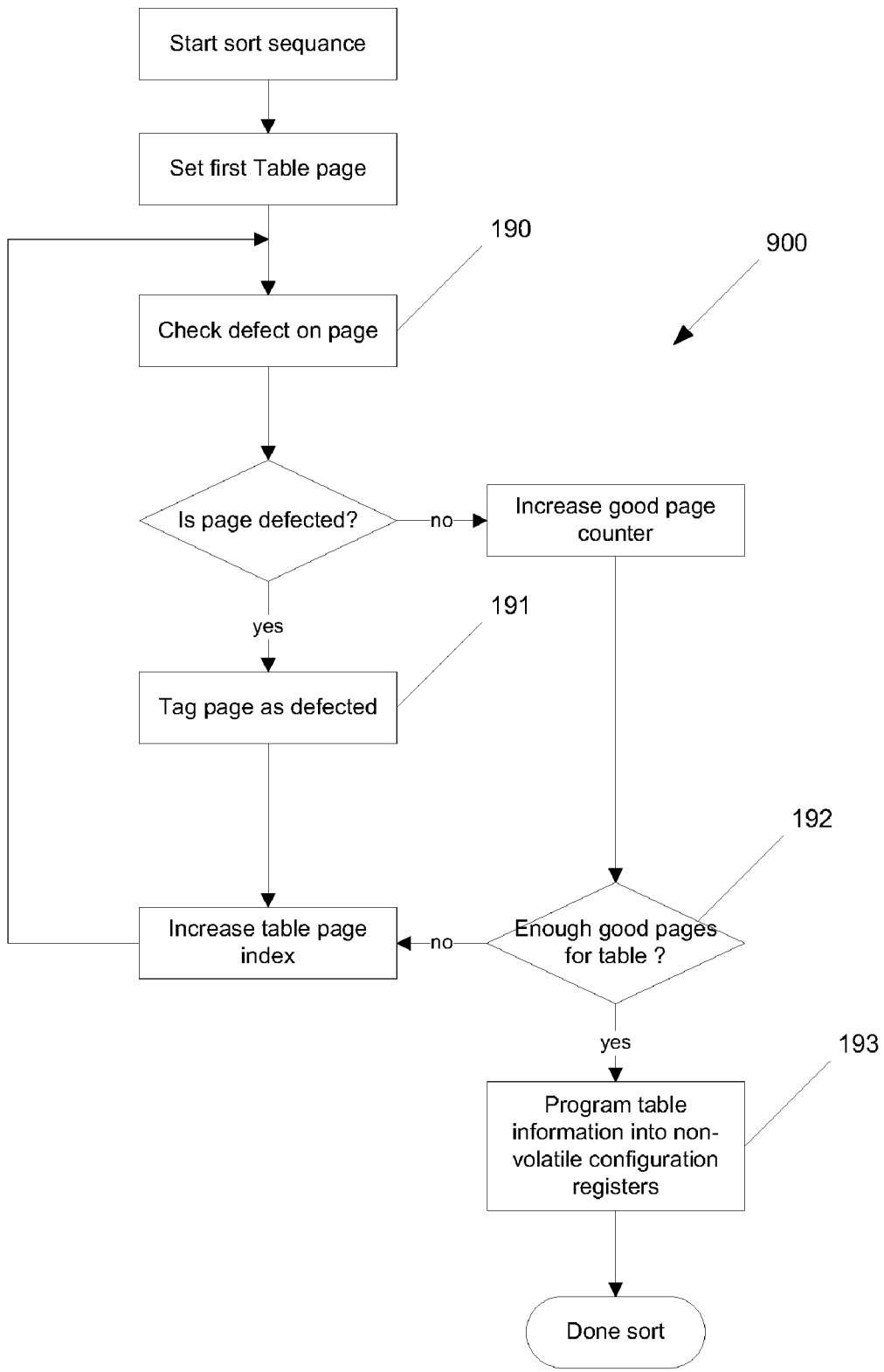

FIG. 10 schematically depicts sorting algorithm 900 according to an exemplary embodiment of the current invention, ensuring that redirection table 400 and FAM table 800 will not be allocated to defective blocks.

Figure 11:
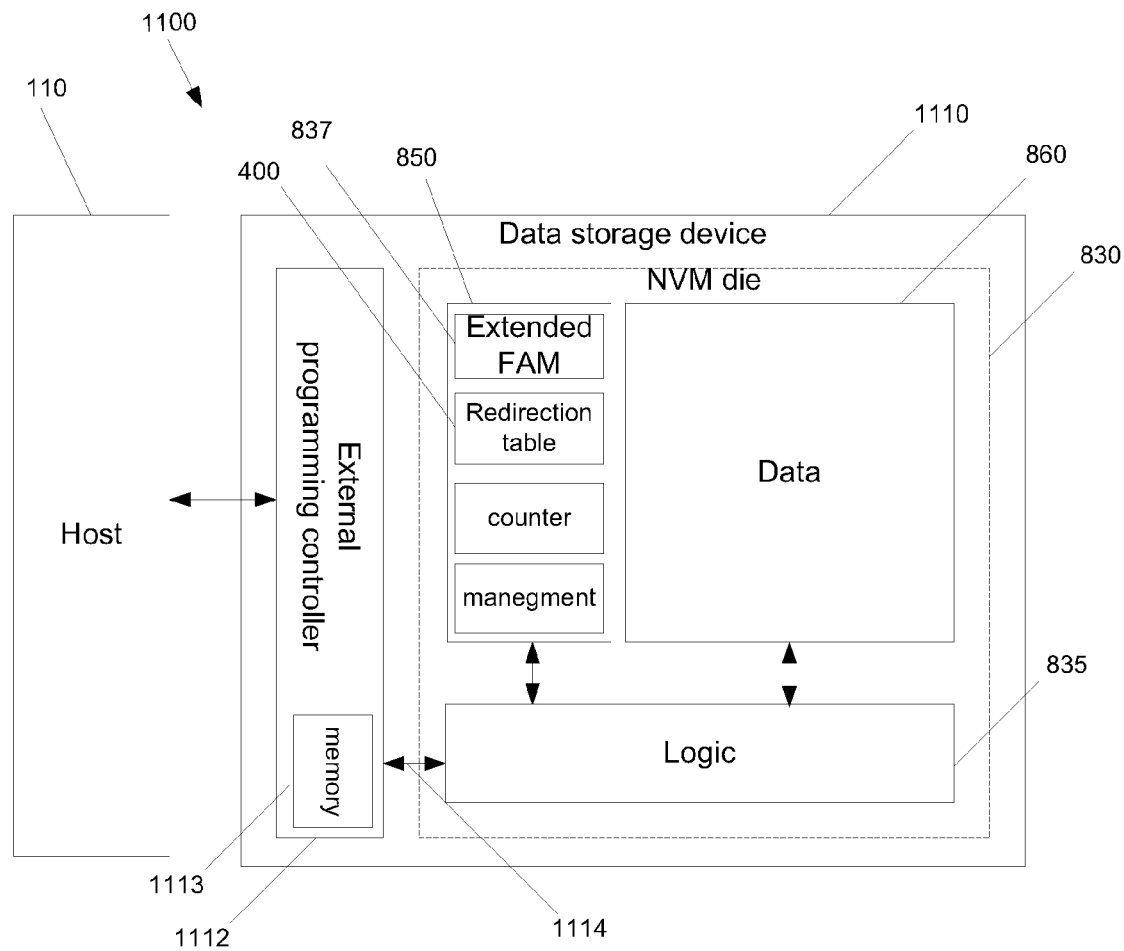

FIG. 11 schematically depicts a programming system using an external controller for uploading user information to NVM according to an exemplary embodiment of the current invention.

Figure 12:
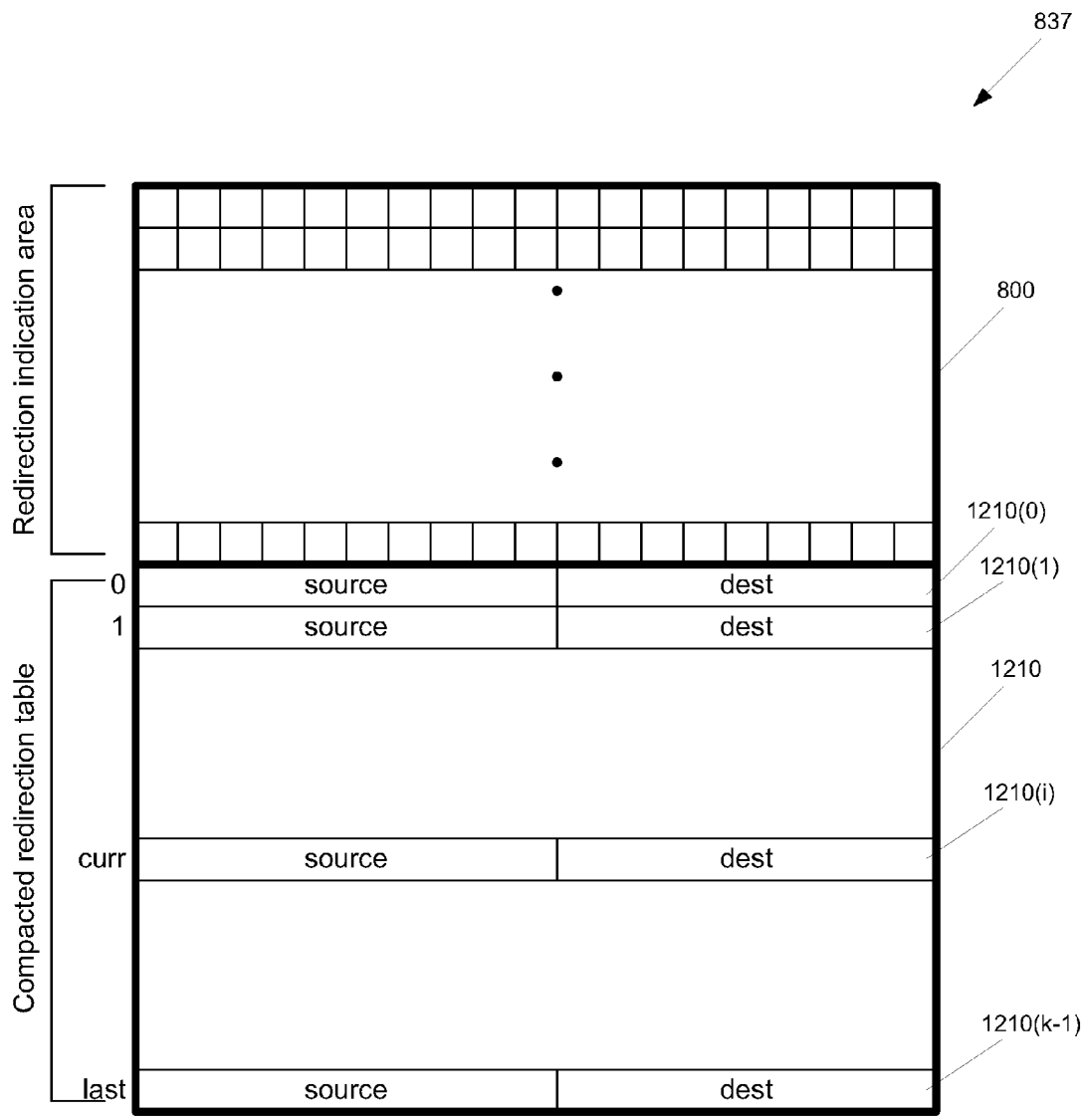

FIG. 12 schematically depicts the extended FAM section 837 according to another exemplary embodiment of the invention.

Figure 13:
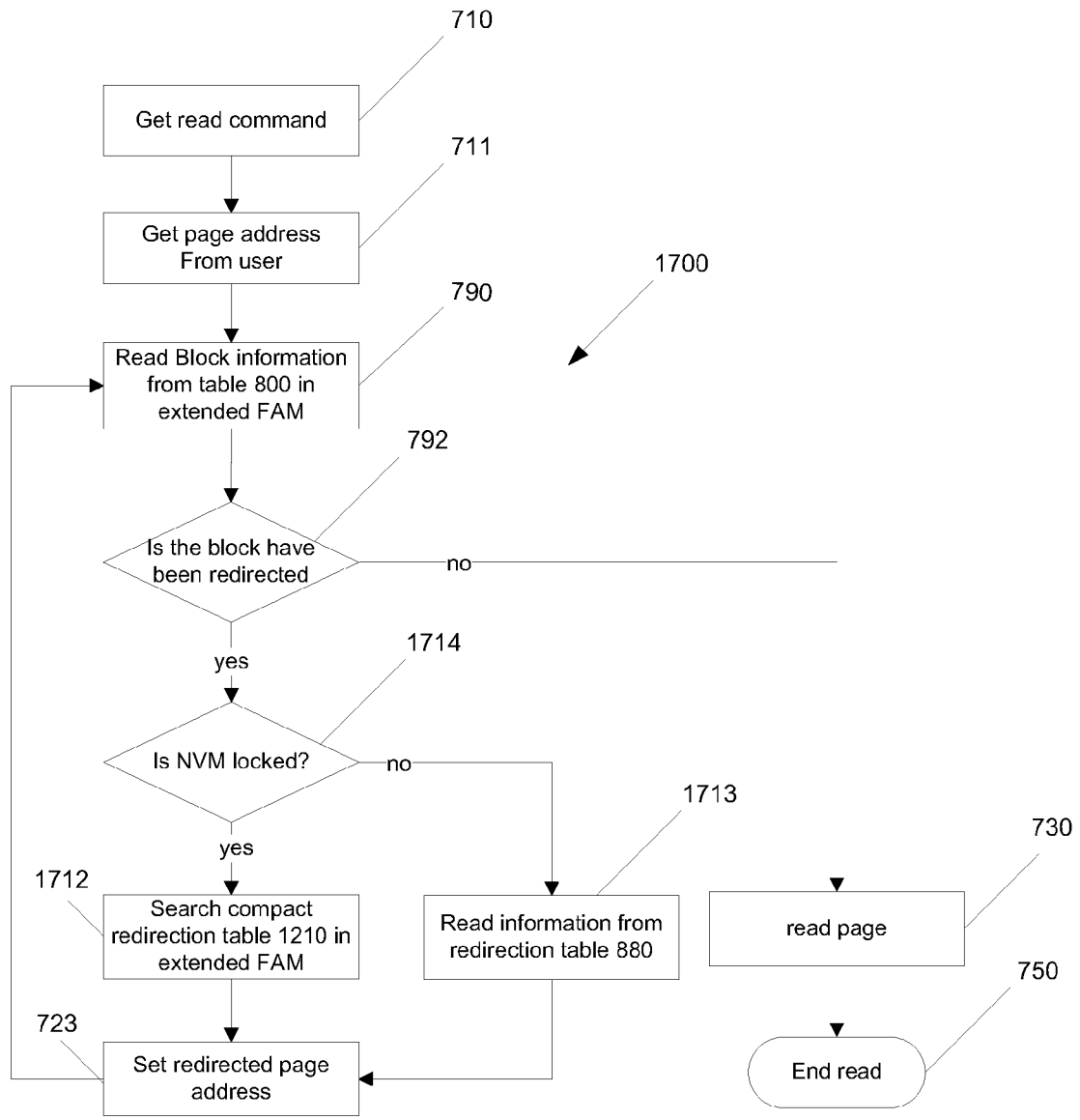

FIG. 13 schematically depicts a block diagram of improved reading algorithm 1700 using extended FAM table 837 according to exemplary embodiment of the current invention.

Figure 14A:
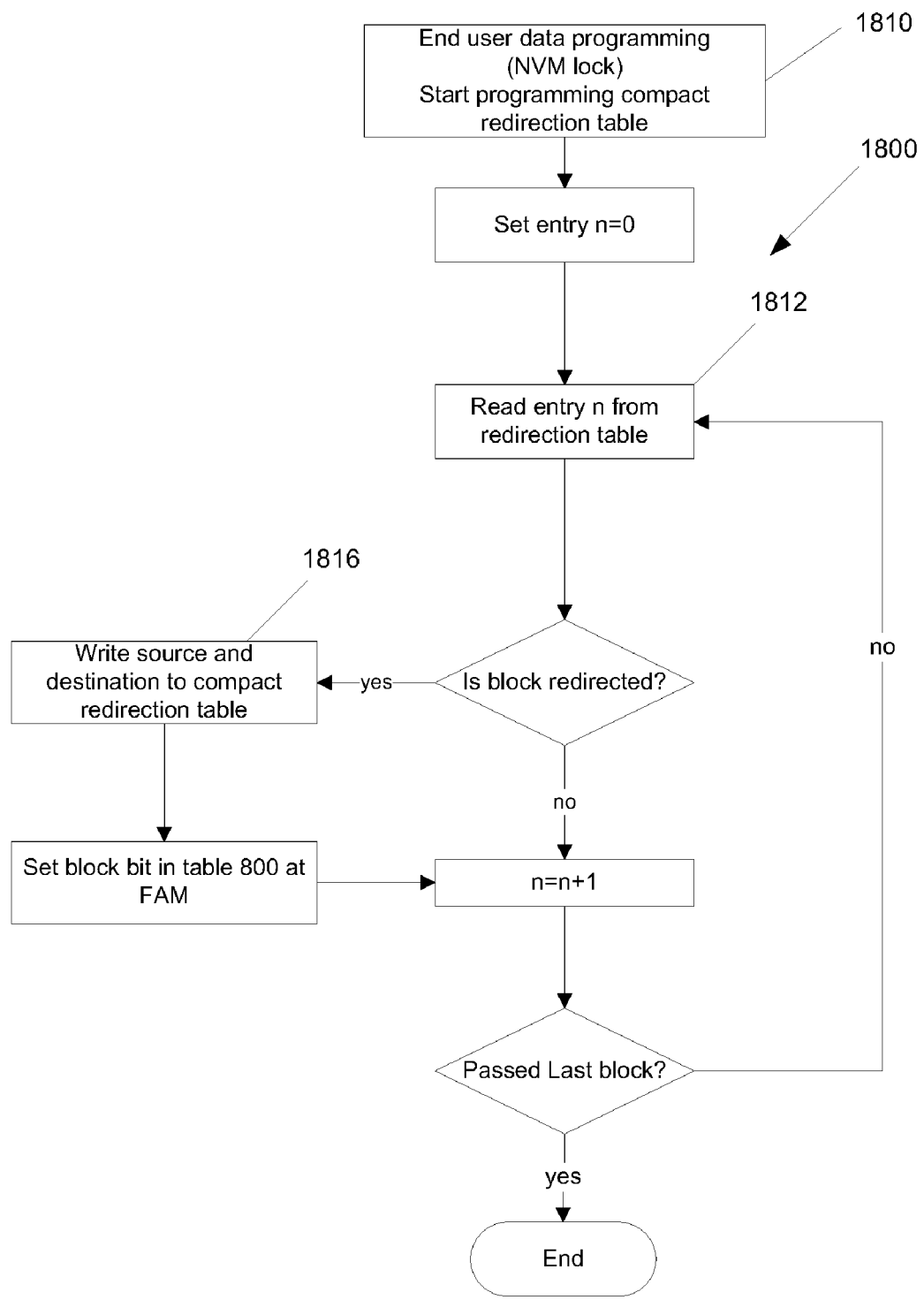

FIG. 14a schematically depicts a block diagram 1800 of an algorithm for constructing concise redirection table 1210 according to an exemplary embodiment of the current invention.

Figure 14B:
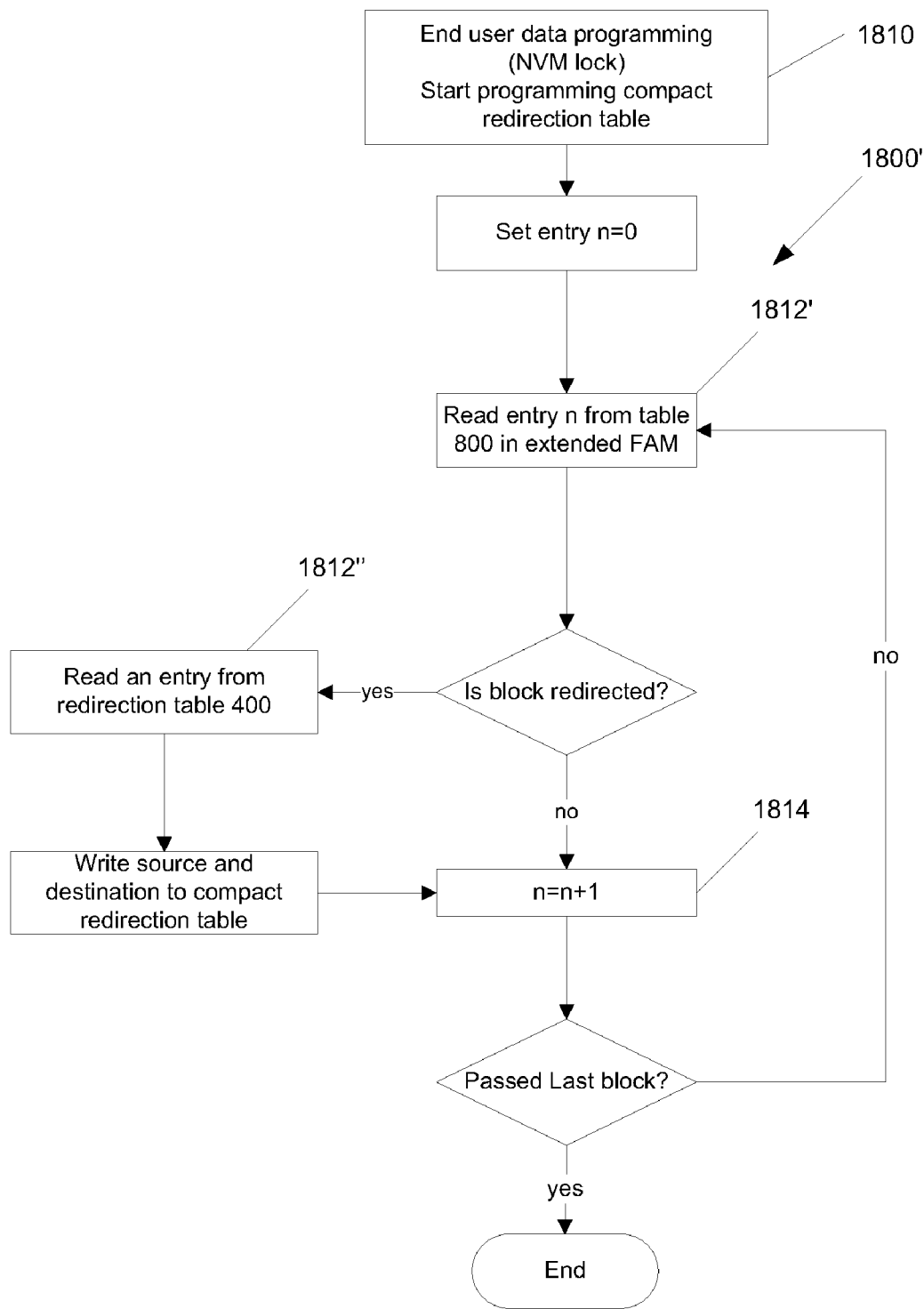

FIG. 14b schematically depicts a block diagram 1800' of a modified algorithm for constructing of concise redirection table 1210.

Figure 14C:
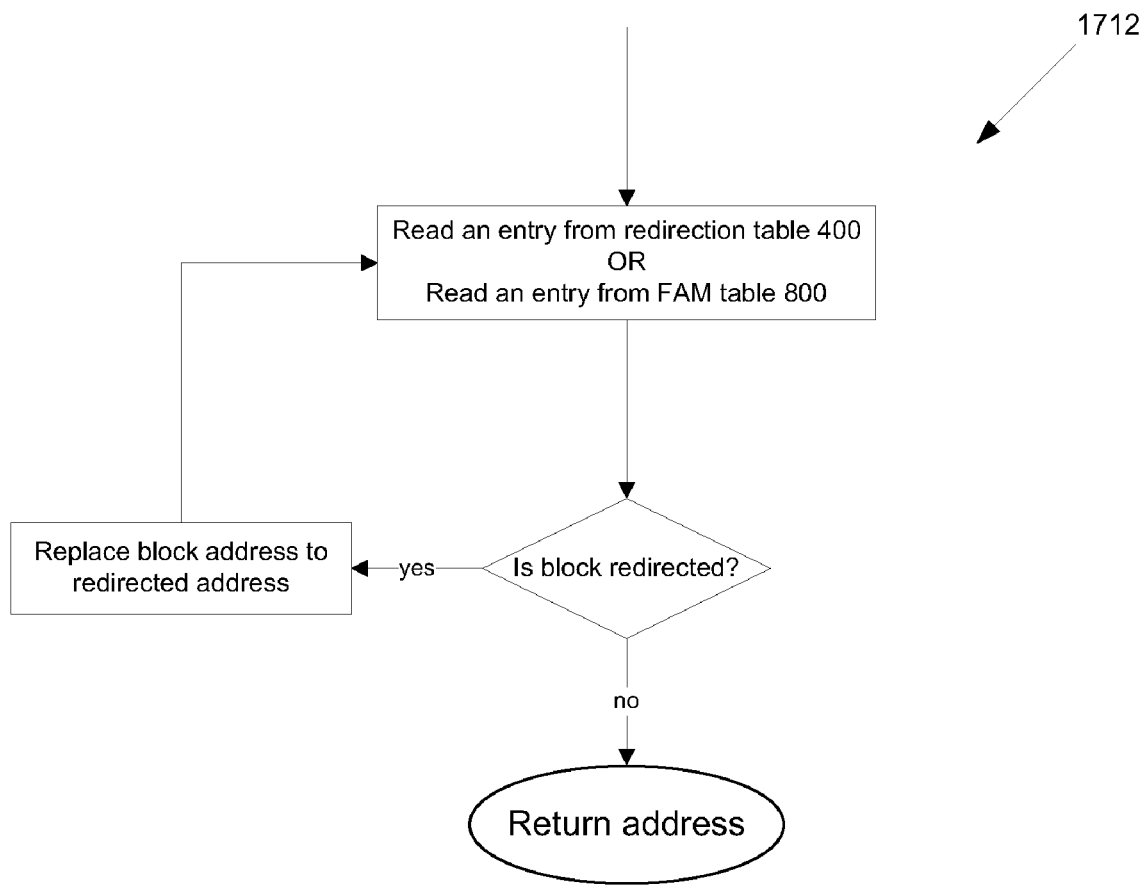

FIG. 14c schematically depicts a method for eliminating multiple redirection entries from concise redirection table 1210 according to an exemplary embodiment of the current invention.

Figure 15A:
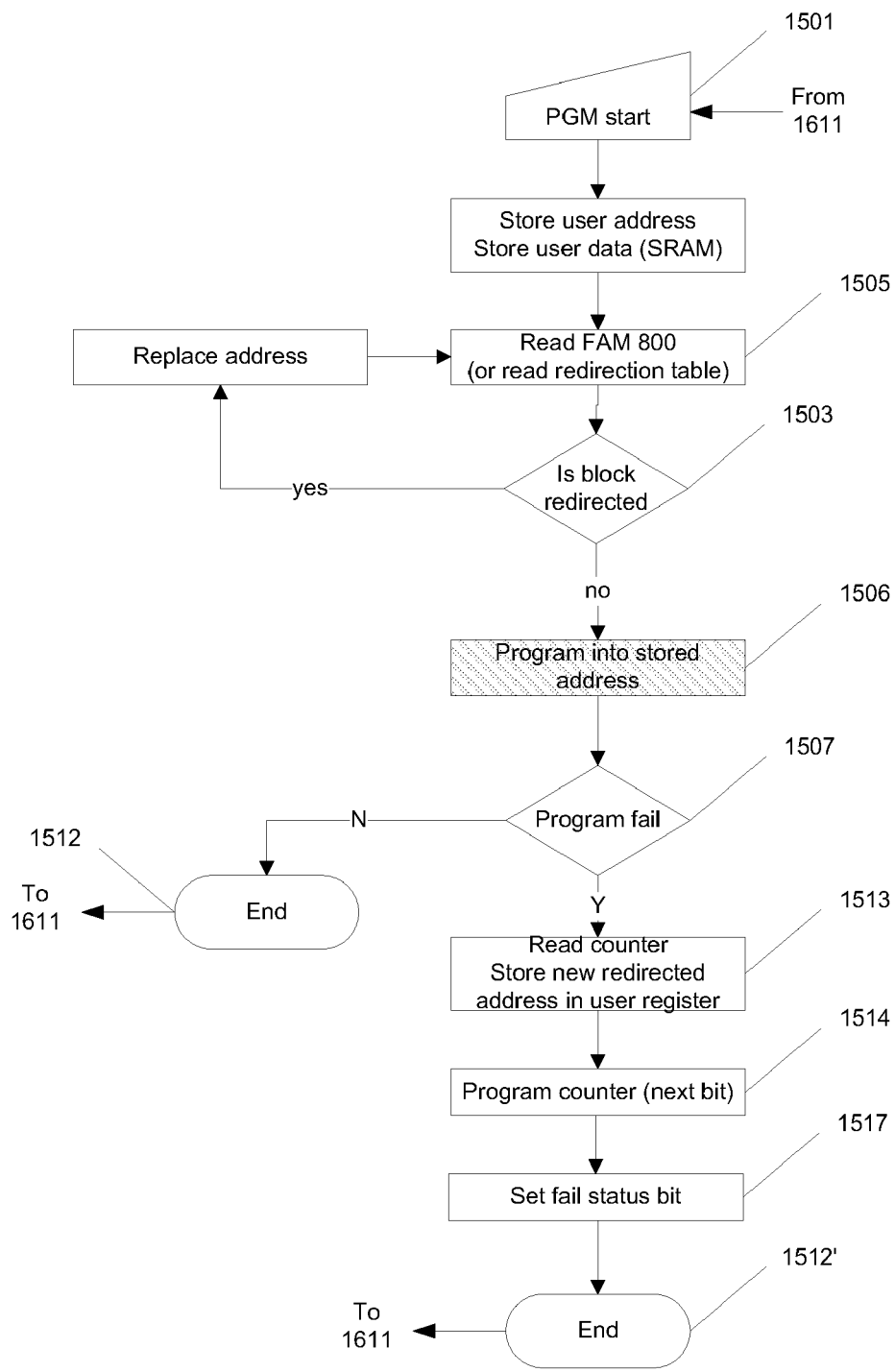

FIG. 15a schematically depicts the process performed by logic 835 during page programming according to an exemplary embodiment of the current invention.

Figure 15B:
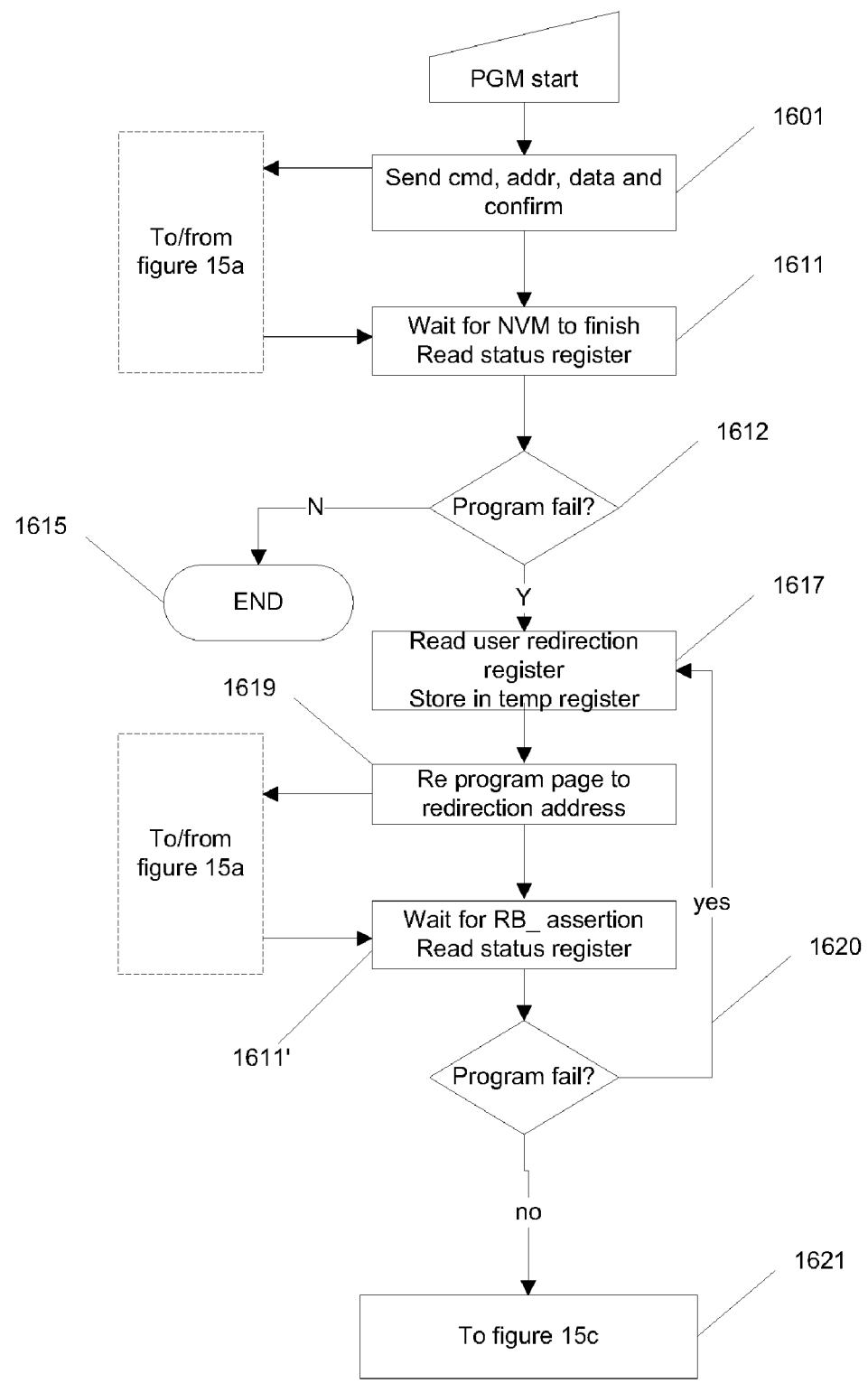

FIG. 15b schematically depicts first part of the block diagram of the process performed by the controller during page programming according to an exemplary embodiment of the current invention.

Figure 15C:
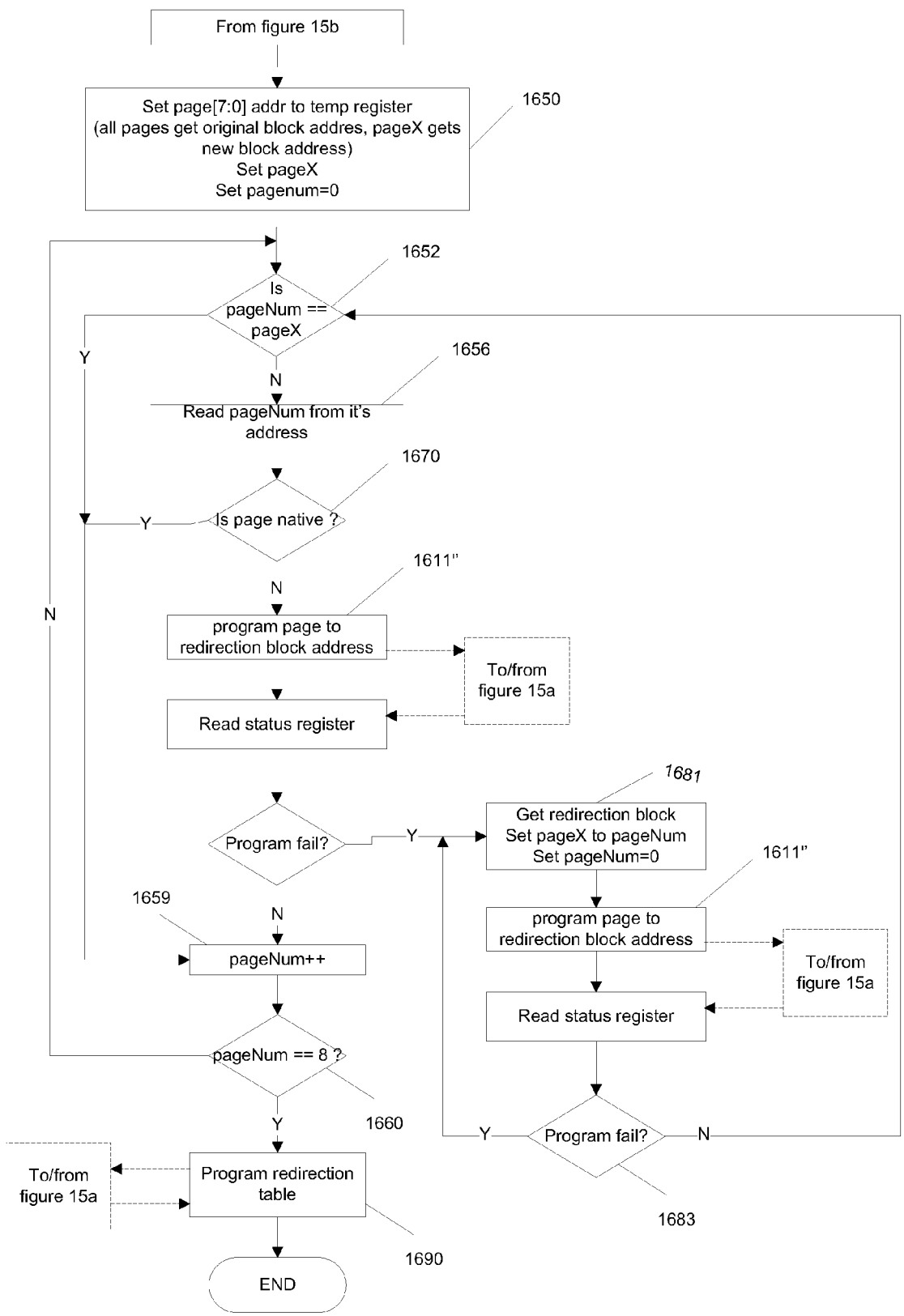

FIG. 15c schematically depicts second part of the block diagram of the process performed by the controller during page programming according to an exemplary embodiment of the current invention.

Figure 16A:
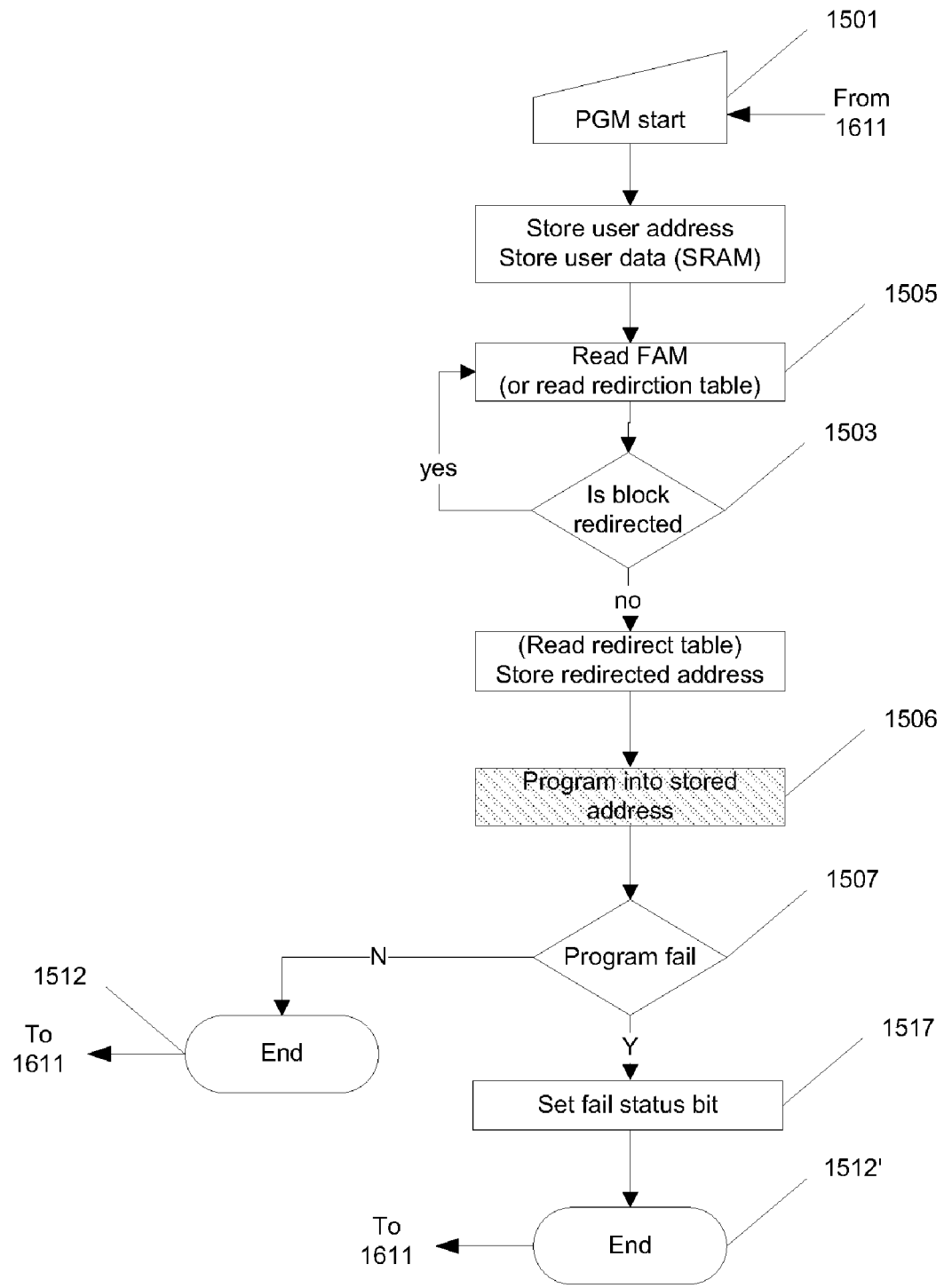

FIG. 16a schematically depicts part of the process performed by the logic during page programming according to an exemplary embodiment of the current invention.

Figure 16B:
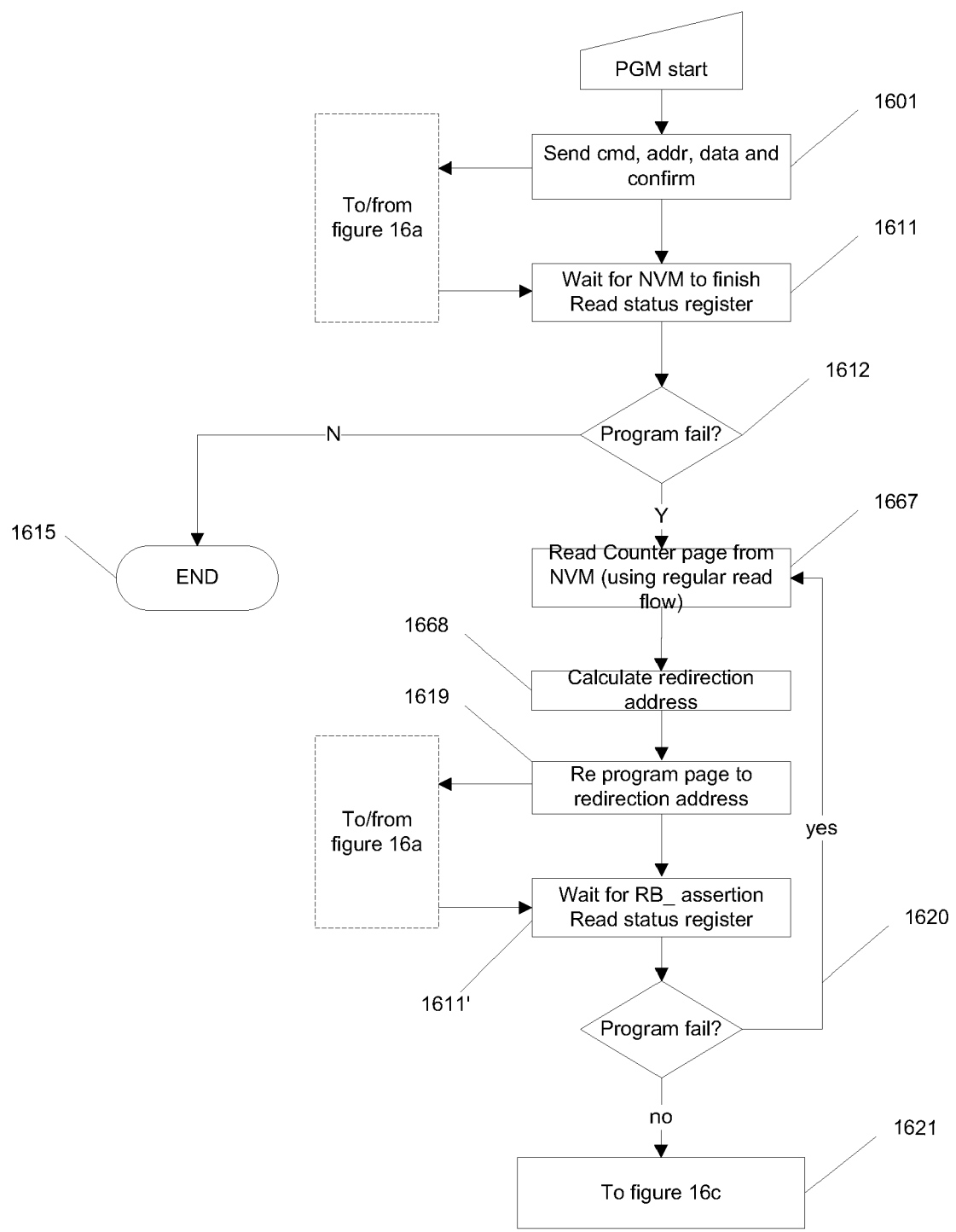

FIG. 16b schematically depicts first part of the process performed by the controller (controller 840 or preferably programming controller 112) after page programming has failed according to an exemplary embodiment of the current invention.

Figure 16C:
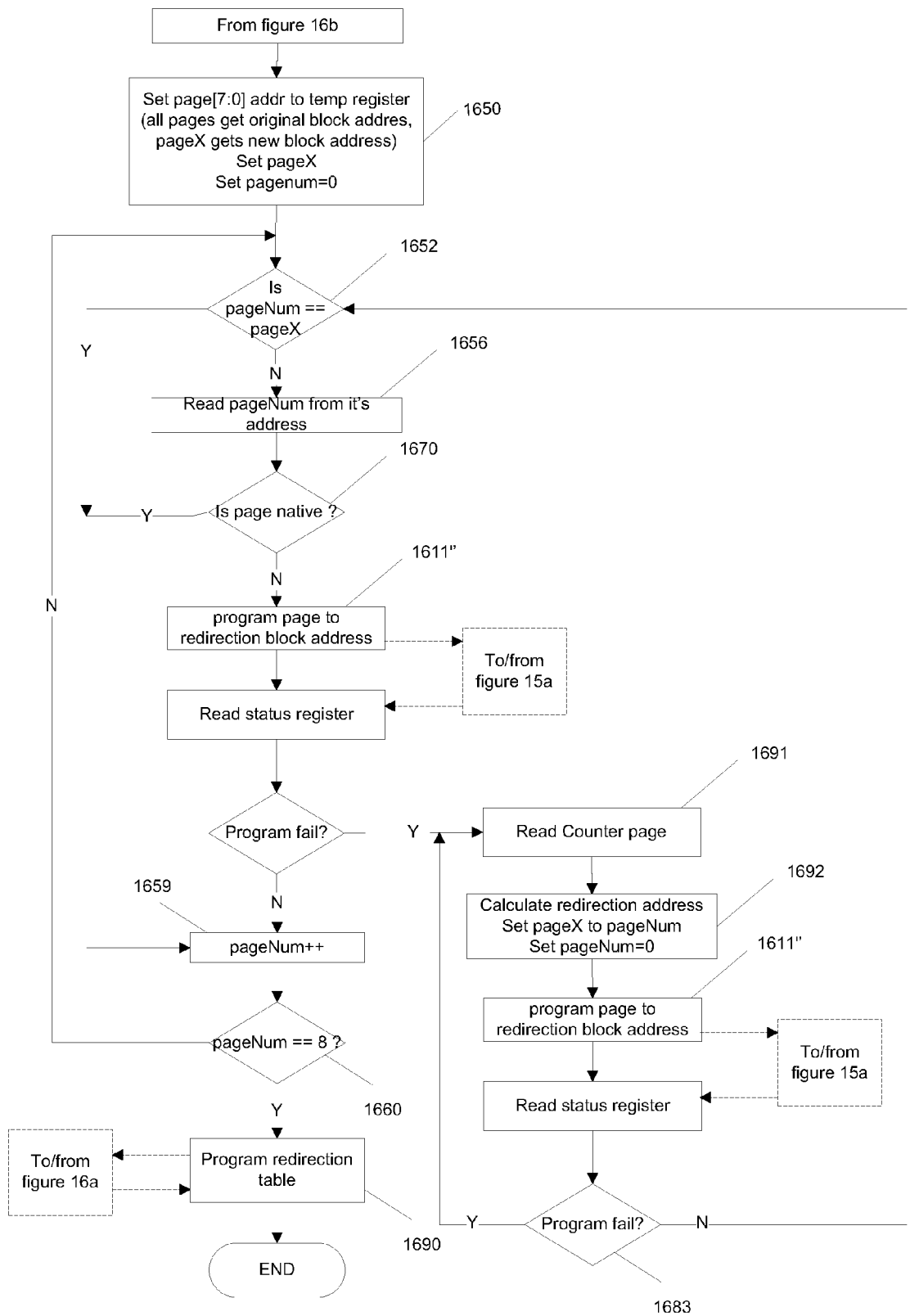

FIG. 16c schematically depicts second part of the process performed by the controller (controller 840 or preferably programming controller 112) after page programming has failed according to an exemplary embodiment of the current invention.

DESCRIPTION OF THE PREFERRED EMBODIMENTS

The present invention relates to an apparatus, system and method for managing files in Non-Volatile-Memory (NVM) based data storage device. In particularly, OTP memories are addressed.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting. In discussion of the various figures described herein below, like numbers refer to like parts. The drawings are generally not to scale. For clarity, non-essential elements were omitted from some of the drawings.

According to one aspect of the current invention, the memory die comprises two different areas: data and code regions.

FIG. 1b schematically depicts a system 813 comprising a host 110 connected to a data storage device 820 according to an exemplary embodiment of the current invention. Data storage device 820 comprises NVM memory die 830; and a controller die 840 in a single package.

Controller 840 further comprises controller memory 845. Generally, controller memory 845 may comprises controller RAM memory (generally volatile memory) used for storing information used by the program executed by processor, and controller's ROM memory (non volatile) used for storing code of the program executed by the controller processor. Controller ROM memory may include parameters, indexes and pointers needed for the controller's operation and its interface with the NVM memory 830.

Controller 840 interfaces with memory logic 835 which write to and read from the memory cells.

According to an exemplary embodiment of the current invention the memory die 830 comprises of at least two dedicated different areas: User data memory section 860 and management code memory section 850. Preferably, data region 860 and code region 850 are made with same memory cells technology. Thus, the same sensing and driving circuits may be used for writing to and reading from both data region 860 and code region 850. However, optionally, data region 860 and code region 850 uses different architecture and logic arrangement to allow smaller blocks in code region 850 compared to data region 860. User data memory section 860 is data area and it is used for the user data storage. Information such as data files, music files or pictures are stored in this section.

To enable random access capability in code region with 1 bit or byte accessibility compared to 0.5-4 KB accessibility in data region, NROM technology can be utilized. NROM technology incorporates virtual ground array architecture and enables both RAM (Random Access Memory) capability for code application and high density 4 bits per cell approach for data applications.

The code area may be for example with shorter word lines in code region 850 to allow faster reading and writing times due to lower capacitance of these lines. Additionally, shorter address used to specify cells in code region 850 may allow faster reading and writing times. Additionally or alternatively, sensing and/or driving parameters may be differently set to optimize writing to and reading from code region 850 and data region 860. Alternatively; different sensing and/or driving circuits may be used for the different memory regions.

The code area may be build with the same structure as the data area, however in this area writing and reading preferably uses 1 or 2 bit per cell method is used for faster reading cycles and better reliability. In a 4 bit per cell method the sensing scheme requires several sequences of read cycles until the data is read correctly. In a 1 or 2 bit per cell method read is done only once due to the large reliability margins.

Code area 850 may be used for bad blocks management as well as for file management information such as MBR, PBR, root directory and FAT. Bad block management region may incorporate redirection table 838 Fast Access Memory (FAM) tables 838. Logic 835 further interfaces with FAM redirection indication table 800 and redirection table 838 where FAM 837 is configured to be read faster than user data memory 860 and optionally also faster than other regions in code data 850. However information capacity of FAM 800 is limited.

According to an exemplary embodiment of the invention, code area 850 is preferably formed in dedicated mini-array within the die with memory size below a few MB's; where the capacity of user data section 860 may be 64 MB-2 GB or more.

According to an exemplary embodiment of the invention, minimal update chunk within the code area 850 is single byte or single bit while the minimal updated region within the data region 860 is page size of 0.5-4 KB According to an exemplary embodiment of the invention, cell's structure of code region 850 and data region 860 is identical. According to this exemplary embodiment of the invention, cell's structure is preferably NROM cell, wherein:

One or two bits per cell may be stored in code region 850 for improved reliability where Single Level Cell (SLC) methods are used; while four bits per cell may be stored in the data region 860 where Multi Level Cell (MLC) methods are used.

FIG. 2a depicts the physical memory arrangement inside a flash memory, for example the user's data section 860. Page is the basic memory chunk that is available for user access. The array is build out x*y pages arranged in a matrix of pages of x columns over y rows. Each row of pages is one block. Often, small portion of the memory array suffers from manufacturing defects and abnormal memory characteristics. When such a phenomena is detected, the whole block associated with the page in which the defected or abnormal behavior was detected is treated as a bad block.

FIG. 2b schematically depicts the process of writing user data into user's data section 860 according to the preferred embodiment of the invention. User's data may be written into the memory array page by page in original continuous address space 232, starting at page 0 in block 0, and progressing to next page till the last page in a block, than continuing to the first page in the next block. Generally, after a page was written, the proper working of the page is tested by an attempt to read the data from the cell and comparing the read data to the data that was written to it. If the two are identical, the page is working correctly.

In the exemplary embodiment of FIG. 2b, all the pages in the first block are working properly. However, the third page in the second block, page (2, 1) is the first page to be found defected. Thus, the page is tagged as bad page 211. Consequently, the entire second block, block (1), is tagged as first bad block 211(1).

A replacement page is then issued and written 214 to the last block namely page (2, y-1) in the spare blocks region 233. This block is used as the first substitution block 222(1). Preferably no more data is attempted to be written to the defected block 212(1) which is tagged as bad block and data already written to it is copied to the corresponding pages in the last block, block 222(1), that is: data from page (0,1) is copied 215 to page (0,y-1); data from page (1,1) is copied 216 to page (1,y-1); etc. More user's data is than written to the next page of the last block until the last block is completely written. Writing user's data is resumed at the first page in the next available block following the defective block.

Should a second page be found defective, the block preceding the first substitution block is used. In this way, the block before last 222(2), block y-2, substitutes the second defective block 211(2).

As user data is being written from the beginning of the array and more bad blocks are possibly found, substitution blocks are written from the end of the array until eventually the substitution blocks section 232 meets the data section 233 and the useful blocks in the array are all used up and no more user's data can be written.

The method of writing data according to the current invention guarantees that all the useful memory blocks would be utilized. Moreover, most of the user data is written to its intended locations. Only data that was attempted to be written into bad blocks is displaced and written into corresponding pages in a spare blocks region. If a spare block is found defected, it is treated as any other defected block: the data intended to it is written in the preceding block.

It is another object of the current invention to provide a method enable easy and fast access to the spare blocks during write and read commands.

FIG. 3 schematically depicts Fast Access Memory (FAM) redirection indication table 800 used for acceleration of read command according to an exemplary embodiment of the current invention. FAM table redirection indication 800 consists of information indicating if a specific block was replaced or not. Naturally, this requires one bit to be associated with each block. In the depicted embodiment, the native state of the memory cells is state "1" and the bits 830 are associated with a replaced blocks are programmed to state "0".

Since density of bad blocks is low, each bit in FAM redirection indication table 800 may be associated with plurality of blocks, for example 2, 4, 8, or 16 blocks. Naturally, this reduces the size of FAM table redirection indication 800. Preferably, FAM redirection indication table 800 is stored in code region 850. Alternatively, it may be allocated in user data section 860. The choice of location of FAM redirection indication table 800 depends if it is incrementally created. If so, FAM redirection indication table 800 needs to be stored in code memory section 850 since it is updated one bit at a time whenever a bad block is discovered. However, if FAM redirection indication table 800 is prepared in advance with no need for field programmability, the entire table may be programmed page by page. Note, fast access to the FAM table may be realized by implementing it in code region 850. Further improvement in access time may be achieved by adjusting the cells which construct FAM table in a manner to allow faster drive current as an example.

Upon detection of bad block in FAM table as depicted in FIG. 3, the redirection table, 400, shown in FIG. 4 is addressed. FIG. 4 schematically depicts the data structure of redirection table 400, showing n pages 410(0) to 410(m-1), each page comprising redirection lines 411(0) to 411(255).

Each word index in redirection table 400 represents a block of the user 860 data area while the content of each word points to the associated replacement block address:

a) word 0 on control page 0 represent block 0 of the array
b) word 1 on control page 0 represent block 1 of the array c) word (m−1)*256 on control page (m−1) represents block (m−1)*256 of the array In this example, the redirection table is composed of pages 410, each may be composed of 256 words, 411(0), 411(1), . . . 411(255) with 16 bits per word. Up to 64K blocks in the array may be mapped using 16 bits words. The number of pages in the redirection table is determined by the total number of blocks and the number of blocks that are pointed by each page. Hence, the number of pages in such a case is set by the die partition; for a die with 64K blocks, 256 pages are required as 256 blocks are indicated by each page.

According to an aspect of the invention, redirection table 400 is used for storing information regarding spare blocks. For each block in the continuous memory address space, there is information stating if the block location was changed in the replacement process during data writing, and if so—what is the address of the spare block. It should be noted that the number of spare blocks is small compare to the total number of blocks, typically ~2%.

According to embodiment of the current invention, each word 411 in the redirection table 400 is associated with a specific block (good or bad) in the user region 860 where the index of the word relates to the block address and the content of the word relates to the redirected address; located in region 233 (FIG. 2b) if the block is defected.

It should be noted that data loading order need not be sequential from the beginning of the array 860. In fact, data may be written in random order, as long as enough rows are left at the end of the array to be used as replacement blocks. Replacement blocks are used chronologically starting at the array's bottom. It is assumed that the file operating system is controlling and handling the block allocation for data writing, and it is an object of the invention to manage bad blocks and present to the operating system an uninterrupted logic address space as if it was a continuous address space. Moreover, the methods according to the current invention are independent from higher-level data management methods which are assumed to operate at the host and the controller level and manage the logical locations, structure and order in which data is written to and read from the array.

It should be noted that often, a defective block is detected by trying and failing to program the first page. This is the case where the defect is in the lines leading to the block or other block related defects. Thus the number of times that data in pages which already been programmed needs to be moved is relatively small.

Table 400 is preferably stored in code memory section 850 of memory 830. Specifically, this is the case where the data is field programmable at different sequences. In that case, redirection table 400 needs to be updated line by line. If however, data content loading is to be carried out at single sequence, for example at the manufacturing or system assembly factory, the redirection table may be prepared in advance and the location may reside in user data region.

FIG. 5 schematically depicts the data format in a page 410 of the redirection table 400 according to an exemplary embodiment of the current invention.

Table 400 comprises a plurality of pages 410, here seen as page 410 to last page 410(m). When program command is issued and failed, the redirection table replaces the bad block with a spare block. Yet, in order to trace the available spare blocks and those which already been used, a counter is used as depicted in FIG. 6. A counter is required in order to store the location of the last block that the system allocated for the redirection purposes. This block is located at m+1 blocks from the end of the array, wherein m is the number of bad blocks already encountered.

FIG. 6 schematically depicts the use of a counter 510 within code memory section 850. Depending on the cell technology, the cell may be programmed from its native state. In the depicted example, the native state is logical "1" and the cell may be programmed to logical state "0". In FIG. 6(i), counter 510 represent the initial state of the counter wherein all bits are in state "1", representing zero bad blocks already encounters. After the first bad block was encountered and replaced, the first (Least Significant Bit (LSB), bit 521 of counter 510 is programmed to state "0" as can be seen in FIG. 6(ii).

Each time a bad block is encountered, another bit is programmed as can be seen in FIG. 6(iii) showing the LSB 521 and the next bit 522 in state "0", representing the numerical value of two redirected blocks. The memory space allocated to counter 510, namely N bits, needs to be large enough to accommodate the maximum number of bad blocks that may be found in user's data section 860. It should be noted that the non-volatile nature of counter 510 is used to ensure that this number may be recovered on power-up of the device. Thus, on each power up, the number of programmed bits in the counter 510 needs to be counted once.

Alternatively, the number of bad blocks already encountered may be stored in a non-volatile re-programmable memory location or register if one available, for example within controller memory 845.

FIG. 7a schematically depicts flow chart 600a of the first stage of algorithm used to write user data page into user's data memory section 860 according to the exemplary method of the current invention.

When the die memory logic 835 receives a command 610 to write data to a page, it receives the data and the address 612 to which the data is intended to be written. FAM is first addressed 621 and if required redirection table 622 is than accessed and the exact location of the page to be written is traced 623. The higher-level management system is unaware that a block was found defective as the data is loaded to a continuous logic address space. Once a valid block address was found, page data is programmed as depicted by flow chart 600b of the second stage of algorithm depicted in FIG. 7b.

FIG. 7b schematically depicts flow chart 600b of the second stage of algorithm used to write user data page into user's data memory section 860 according to the exemplary method of the current invention.

At the second stage 600b, an attempt is made to program the data 650 into the page. Integrity of the programmed data is tested 651 by reading the data from the page and comparing the read data to the written data. If the read and written data are identical, the page programming is completed 652. Next page can be started according to 600a and 600b.

However, if the page is found defective 661, address of new assigned replacement block is read 662 from counter 510. Counter 510 is updated 663 and the replacement block address is set 664. Attempt is then made 665 to program the data into the corresponding page in the redirected block. Programming is verified 669, and if the attempt fails 666, the next spare block is issued. If the programming is successful 667, the redirected block is presumed to be defect free.

If the page that was programmed is the first page in the block, page programming ends 652. Sequential data programming will resume on the second page of the redirected block. If the programmed page is not the first, attempt is made 670 to copy the data in all the preceding pages, which presumably were already programmed on the now defective block as depicted in FIG. 2b. If copying of any of the preceding pages fails 678, a new spare block is chosen and the process re-starts by attempting to write the page data that failed at step 661.

Preferably, if copying 670 is successful 672, redirection table is updated 673 and the page programming is completed 652. Sequential data programming will resume on the next page of the redirected block. This is preferably done because step 664 is updating the logic internal register with the redirection page address, and step 673 is writing the page address into the redirection table.

FIG. 8a schematically depicts an algorithm 670a for copying data from pages on a defective block to a redirected (spare) block according to an exemplary embodiment of the current invention. As depicted in step 670 in FIG. 7b, if a defective page is detected on a block and the page is not the first page on that block, data from the preceding pages on that defective blocks are preferably copied to the redirected block.

According to the exemplary of the current invention, once the defective block is identified and a redirected blocked is issued 171, the address of the first page in the defected block is set 172 and data from the page is read from user's memory 860 to RAM within logic 835. Page data is then written from the RAM within logic 835 to the redirected block in user's memory 860. The page number is tested 175 to see if the last page to be copied (the page before the page that was found to be defective) was reached. If so—the copy process is completed 179. If not, the address of the next page to be copied is set 176 and the copying process is repeated 173.

FIG. 8b schematically depicts an algorithm 670b for copying data from pages on a defective block to a redirected block location using ECC according to a preferred exemplary embodiment of the current invention. It should be noted that both writing and reading NVMs are prone to errors. The controller 840 is preferably configured to detect and correct such mistakes using Error Code Correction (ECC) methods.

According to the preferred of the current invention, once the defective block is identified and redirected page is issued 171, the address of the first page in the block is set 172 and data from the page is read from user's memory 860 to RAM within logic 835. Page data is transferred 181 to controller 840 that checks and correct the data using ECC 182. The corrected data is then returned 183 to the logic RAM. Page data is than written from the RAM within logic 835 to the redirected block in user's memory 860.

The page number is tested 175 to see if the last page to be copied (the page before the page that was found to be defective) was reached. If so—the copy process is completed 179. If no, the address of the next page to be copied is set 176 and the entire process is repeated.

FIG. 9 schematically depicts reading algorithm 700 according to an exemplary embodiment of the current invention of NVM device such as device 830 which was programmed by an algorithm such as disclosed in FIGS. 7a and 7b according to an exemplary embodiment of the current invention.

It should be noted that optionally reading is done after programming of the device is completed due to programming of all the available memory space or all the needed data, and the device is locked to prevent additional data programming. Alternatively, data can be read in between data programming stages.

Data reading is initiated by a read command 710 from the host or internally from the controller. Address 711 of page to be read is obtained or computed by controller 840. The obtained address is then tested to check redirection status by first addressing FAM redirecting indication table 790, and testing if the block was redirected 792. If the block was redirected—accessing the redirection table 712 is required.

If the page is not on a defective block, and was not redirected, the data is read from the page 730 and page reading is completed 750. If the page was found to be on a redirected block, block address is set to the redirected block 723 as appears in the redirection table 400 and read block information 790 and subsequent steps are repeated to verify that the redirected block was not defective and was not redirected too.

FIG. 10 schematically depicts sorting algorithm 900 according to an exemplary embodiment of the current invention, ensuring that redirection table 400 and FAM redirection indication table 800 will not be allocated to defective blocks.

Redirecting the locations of redirection information tables may slow down both writing and more so reading process as these tables are frequently used during reading. In some cases, reading and or writing process may become unstable if redirection tables are redirected themselves.

Sorting algorithm 900 is preferably performed during device testing at the manufacturing plant. Sorting algorithm is preferably checks 190 one page after another for defects. Defective pages and optionally blocks are tagged 191 and are barred from being part of the memory space available for the redirection tables. Sorting is completed when enough good pages or blocks are identified 192. Addresses of good pages (or blocks) for the tables are programmed into non-volatile registers used during initialization of the NVM device when it is powered up or connected to host. Optionally, sorting continues until enough continuous addresses are located for the tables. Note, in OTP memories this step is limited as program operation can't be carried out as it is a single event. Yet, other tests are possible, for example, checking that these WL are not shorted.

Another aspect of the current invention is to provide a NVM storage device that presents a continuous address space during reading, with minimal modifications to the hardware or software already in use. Preferably, the NVM data storage device that presents a continuous address space during reading will have minimal reading latency. Preferably, the mass-produced NVM data storage device is configured to be a low cost device. Thus, the NVM data storage device is preferably produced with the minimal resources needed for its operation. For many applications, the end user uses the NVM data storage device as a read-only memory.

In these applications, the minimal resources are the resources needed only to read the user data stored. In some cases, the user data may be pre-programmed into the NVM during manufacturing using a programming apparatus. In these cases, the programming apparatus may comprise a controller having more computation resources, for example larger memory than the controller used for reading the memory during use by the end user. An example for such application may be a toy company that obtain blank NVM dies and program their data and or operation instructions before integrating these NVM dies into their toy products.

Similarly, music and video content may be programmed into NVM before sale. Another example is NVM used as "digital film" which is "programmed once" by a digital camera having the proper hardware and software for such programming, and may be read many times by any card reader.

In all these applications, the reading apparatus is presented with a continuous address space, hiding the existence of bad blocks and the fact that information destined to bad blocks was redirected to redirected block locations.

FIG. 11 schematically depicts a programming system used for uploading user information to NVM according to an exemplary embodiment of the current invention.

Programming system 1100 comprises a programming board 1110 having an external programming controller 1112. Controller 1112 is preferably a controller having larger computing resources (for example larger memory 1113 than controller 840 of FIG. 1b). NVM die 830 interfaces with programming board 1110 via connector 1114 which is preferably a quick release connector. Optionally, programming board 1110 is configured to interface with and program a plurality of NVM dies at the same time. Preferably a plurality of programming boards 1110 are connected to a host (not seen in this figure) which upload user data to boards 1110.

After NVM die 830 was programmed, it is removed from programming board 1110. In some applications, programmed NVM die 830 is combined with controller 840 (preferably of lower complexity and cost compared with external programming controller 1112), and packaged as data storage device 820.

In some embodiments, data storage 820 may be already assembled or integrated on one silicon die. In these cases, programming by an external controller on a programming board may be done by bypassing controller 840 and interacting with logic 835. Optionally, interfacing the programming controller to logic 835 is done through a programming connector.

According to the exemplary embodiment depicted in FIG. 1b, NVM die 830 comprises FAM redirection indication table 800. It should be noted that reading information from FAM is much faster than reading information from non-FAM sections of the NVM memory such as user data 860. For example, reading data from FAM may take few logic cycles, while reading non-FAM data may require one hundred or more cycles of logic 835.

Referring to FIG. 4, we notice that redirection table 400 comprises a word for each user data block, regardless of the block being good or bad. In fact, redirection table 400 is very sparse, as only small percentage of the blocks is bad. Storing the entire redirection table in FAM may be impossible due to the limited capacity of the FAM, or too costly due to the higher relative cost of FAM capacity.

FIG. 12 schematically depicts the extended FAM table 837, consisting of original FAM redirection indication table 800 as depicted in FIG. 3 and concise (compacted) redirection table section 1210 according to another exemplary embodiment of the invention. Concise redirection table 1210 comprises k redirection entries 1210(0) to 1210(k−1), wherein an entry in 1210 indicates a redirected block.

For example, entry 1210(i) indicates a block "i" which was redirected from its original block address (its source) 1210s(i) to its redirected address (destination) 1210d(i). Number of bits in each address is selected to accommodate the maximum address space. The space reserved to the concise redirection table 1210 depends on the total number of blocks (which determines the number of bits needed to define the source and destination addresses) and the total amount of allowed bad blocks.

Preferably, entries 1210 are arranged to enable efficient search. For example, entries may be arranged in ascending or descending order of their source address 1210s. Monotonous arrangement of entries 1210 enables the use of efficient binary search algorithm. However, other search algorithms may be used. For example, extended FAM 837 may comprise indexing information that enables speeding up the search. For example, most used addresses may be grouped and saved in high priority locations.

Additionally, extended FAM section 837 may also comprise code area 1220 in which other information may be stored.

FIG. 13 schematically depicts a block diagram of improved reading algorithm 1700 using extended FAM 837 having a concise redirection table 1210 according to another exemplary embodiment of the current invention.

Improved read algorithm 1700 differs from reading algorithm 700 of FIG. 9 by replacing the step 712 of addressing the redirection table 400 to find the redirection address of a redirected block with step 1712 which is searching the concise redirection table 1210 and reading the destination address associated with the source address of the redirected block.

While searching a sorted list (such as the concise table 1210) requires more steps than looking at indexed table (such as redirection table 400), the difference between the short access time of FAM and the longer read time of non-FAM memory more than compensate and indeed may give advantage to the improved algorithm 1700 over algorithm 700.

Consider for example an NVM die with N blocks, where K are redirected blocks; and wherein non-FAM access time is X time longer than FAM access time. Reading the redirection table 400 before reading each block, causes an overhead of X*t delay (wherein t is the time taken to read the FAM) for each block reading. Using reading algorithm 700, each block reading have at least an overhead delay of 1*t for reading the FAM redirection indication table 800. If the block was redirected, an additional delay of X*t is needed, thus, a redirected block encounters a (2+X)*t delay overall.

However, the improved read algorithm 1700 is somewhat different—According to the improved reading algorithm 1700, a good block suffers only 1*t delay. Searching the concise redirection table 1210 using binary search is at most t*Log [2,K] and on the average t*(Log [2,K]−1). Thus, as long as (Log [2,K]−1)<X, improved reading algorithm 1700 is faster than reading algorithm 700. Moreover, extended FAM table 837 may eliminates the occurrences of dual and multiple redirections, thus ensuring that no reading will be excessively long.

It should be noted that reading algorithm 1700 of FIG. 13 requires a sorted and updated concise redirection table 1210, and thus is generally applicable only when such table is guaranteed to be present and correctly update. This can easily be ensured after all user's data has been successfully been programmed, and all redirected blocks identified. For example, memory may be "locked" to prevent further user's data programming after the intended user's data has been programmed. However, if data is guaranteed to be programmed sequentially (or at least monotonically) into the memory space, a sorted concise redirection table may be created on the fly.

If there is an indication 1714 that no sorted and updated concise redirection table is available, the algorithm reverts to that of FIG. 9 by reading from redirection table 1713. It should be noted that test 1714 need not be made for each reading command, but instead be made for example on initialization.

FIG. 14a schematically depicts a block diagram 1800 of an algorithm for constructing concise redirection table 1210 according to an exemplary embodiment of the current invention.

After all user data was programmed 1810 and redirection table 400 is completed, an algorithm 1800 is activated to construct the concise redirection table 1210. According to the depicted embodiment, entries of redirection table 400 are sequentially read 1812. Whenever a redirected block is encountered, it is written 1816 into the next available entry of concise redirection table 1210. Naturally, when the entire redirection table 400 is scanned, a sorted concise redirection table 1210 is prepared.

Optionally, redirection information table 400 was already prepared during die sorting or user data programming. However, if optionally table 837 was not prepared, during user data programming, it may be prepared during scanning of redirection table 400

Optionally, scanning of redirection table 400 and preparation of concise table 1210 (and optionally FAM 813) is governed by a external controller having large memory. In these cases, tables may be prepared in the memory of the external controller and than programmed into the FAM.

FIG. 14*b* schematically depicts a block diagram 1800' of a modified algorithm for constructing of concise redirection table 1210'. The modified algorithm 1800' used the FAM redirection indication table 800 for speeding up the creation of concise redirection table 1210. FAM redirection indication table 800 is read 1812', and only if the block was redirected, its entry in redirection table 400 is read 1812".

FIG. 14*c* schematically depicts a method for eliminating multiple redirection entries from concise redirection table 1210 according to an exemplary embodiment of the current invention. According to the depicted embodiment, addresses of a redirected block is tested and if the redirected block is also redirected, only the final destination is written into the concise table 1210.

It should be noted that improved reading algorithms do not use the redirection table 400. Thus, redirection table 400 may be overwritten if written into the NVM. Alternatively, when programming is done by an external controller, table 400 may be constructed in a volatile memory of the external controller and only the concise table 1210 be written into the FAM of the NVM.

Additionally, if the user data is sequentially written (in ascending (or descending) block address only), sorted and concise list of redirections may be created during programming, thus table 1210 may be created directly during programming.

In the following, emphasis is given to the case wherein a block failure is encountered during user data programming. It should be noted that user data programming is performed also during page data copying performed when the programming fail while programming a page which is not the first page in the failed block.

The separation from the reading algorithm is done to enable using commands already existing in the NVM logic. These commands already developed and debugged by the NVM die providers, and adding or modifying such command requires investment in software and/or hardware development causing increase cost and project delay. As NVM die technology advances, it is likely that newer NVM will be provided with logic adopted for its operation.

However, the depicted algorithm should be taken as a non-limiting example and modifications, additions and/or deletion of steps may be done within the general scope of the current invention.

In the following FIG. 15*a* describes method of bad block management owned by the embedded logic 835 and supported by the controller during program operation according to an exemplary embodiment of the current invention.

It schematically depicts the process performed by logic 835 during page programming according to an exemplary embodiment of the current invention. The logic receives 1501 from the controller user's data and address to be stored in internal registers. It then tests 1503 if the user's address is associated with a bad block by reading 1505 the redirection information from redirection indication table 800 in FAM (or extended FAM).

If the address is of a bad block, redirection table 400 is read and the address replaced with the redirected block address. That redirected address is also tested to verify that no re-redirection is needed. The logic perform programming 1506 of the user's data and test 1507 if the programming fail. If programming succeeds, logic 835 reports 1512 to the controller, and waits for next data and address. If programming fails, the logic reads the counter and computes 1513 the redirection address as the next available block in the spare user data memory space. It updates 1514 the counter, and sets 1517 a fail status flag. It then reports 1512' to the controller, and waits for next data and address.

FIGS. 15*b* and 15*c* schematically depicts parts of the process performed by the controller 1112 during page programming and bad block management according to an exemplary embodiment of the current.

In FIG. 15*b*, the controller is of extended capability compared to the case which is associated with FIG. 7-8 where the controller is basic functionality and all tasks are owned by an advanced logic circuitry. In current embodiment, the logic is of simplified design, hence, bad block management during program operation is owned by the controller. The controller sends 1601 to the logic the user's data and address (schematically depicted as "to/from FIG. 15*a*") and waits 1611 for the logic to perform the programming. If the logic returns 1612 a "no fail" flag, page programming is completed 1615, and next page data may be programmed.

If the logic returns a "fail" status flag, the controller replaces 1617 the block address with the redirected address provided by the logic and attempt 1619 to program the user data at the redirected address. The controller then waits 1611' for the logic to perform the programming. If that process fails 1620, the cycle repeats until the page is successfully written 1621.

It should be noted that unlike successful programming 1615, success after failure 1621 requires testing if the redirected page is the first in the block, and if not—the preceding page(s) previously programmed in the (now bad) block need to be copied to the corresponding pages in the redirected block.

FIG. 15*c* schematically depicts part of the process performed by the controller 1112 after page programming has failed according to an exemplary embodiment of the current invention.

In the depicted example, several pages from a given block are addressed (page 0 to page 7). The process generally follows the page copying process 670 already depicted in FIGS. 7*b*, 8*a* and 8*b*. In this exemplary embodiment, it is not assumed that pages necessarily are sequentially written into a block. In this exemplary embodiment of copying pages already programmed into their destination block, all the pages in the defective block (not including the page that was redirected successfully in step 1611 if FIG. 16*a*) are preferably read and if contain user information—are copied into the redirection block. If during copying pages, a programming operation fail, the entire copying process has to repeat itself. Activation of the copying algorithm shown in FIG. 15*c* commence when a page programming in a block had failed and the information was successfully programmed into a redirected block.

In step 1650, the controller stores the current status in its memory. It associate the "original block" number to all the pages, except page number "failed page" which is associated with block number "redirected block". The controller set up a parameter PageX with the value of "failed page"; and a variable pageNum with the value "0". Variable pageNum will be used for cycling over all the pages in the block, one at a time, and (if needed) copying the information in them to the destination block. The controller starts the cycling of pageNum at value "0"; increasing the value 1659 by one, until all page numbers were cycled 1660.

First, the controller tests 1652 if pagNum equal to PageX. If so—the page in question has been already been successfully programmed into the destination block. If pageNum is other than pageNum, the page number pageNum is read 1656 from the block number associated with that page in the current status registered (in this case, "original block" was associated with all (but the failed page) in step 1650).

Read information is optionally is checked ECC and corrected if needed. Read information is tested 1670, and if the page has no information (page native), it need not be copied to the destination page. If user information was read, the information is programmed 1611" to their destination block. If the programming is successful, pageNum is increased 1659, and next pangNum is handled.

However, in some cases, page copying may fail 1681. In this case, the controller:

a) Receives from the logic a "new redirection" block address and modify the "current status" created in step 1650 to associate the newly failed page number with the "new redirection" block address. Obviously, all pages need to be copied to this new redirected block address.

b) The parameter pageX is set to the page number of the recently failed page.

c) The variable pageNum is reset to "0".

Newly failed page is now programmed 1611''' to the new redirection block. If programming fails 1683, a new redirection block is addressed. If the programming of the newly redirected page succeeds, cycling through all pages starts 1652 with pageNum equal to zero per 1681c. Yet, Since parameter PageX has been modified 1681b, the newly failed page need not be copied 1652; and since current status was modified 1681a, originally failed page will be read 1656 from the redirection block and copied 1611" to the newly redirected block, while other pages will be read from original block to newly redirected block.

When coping is completed 1690, the controller updates the redirection table 400 by programming the newest redirection block number into the original block location in the table. Counter and redirection information table 400 are also updated during this copying process.

Bad block management as described in FIG. 15a-c is associated with field programmable controller which is used in both program and read operations. In the following figures, 16a-c, somewhat different scenario is described where program operation is conducted by advanced external programming controller, possibly being part of programming system.

FIG. 16a schematically depicts the process performed by logic 835 during page programming according to an exemplary embodiment of the current invention. The logic receives 1501 from the controller user's data and address to be stored in internal registers. It then tests 1503 if the user's address is associated with a bad block by reading 1505 the redirection information from redirection indication table 800 in FAM (or extended FAM).

If the address is of a bad block, redirection table 400 is read and the address replaced with the redirected block address. That redirected address is also tested to verify that no re-redirection is needed. The logic perform programming 1506 of the user's data and test 1507 if the programming fail. If programming succeeds, logic 835 reports 1512 to the controller, and waits for next data and address. If programming fails, the logic sets 1517 a fail status flag. It then reports 1512' to the controller, and waits for next data and address. Note that in contrast to FIG. 15a, in this embodiment steps 1513 and 1514 are not performed by the logic. According to this embodiment, the computation of the redirection address is performed by the controller as depicted in FIGS. 16b and 16c.

FIGS. 16b and 16c schematically depicts part of the process performed by the controller 1112 during page programming according to an exemplary embodiment of the current.

In FIG. 16b, the controller sends 1601 to the logic the user's data and address (schematically depicted as "to/from FIG. 15a") and waits 1611 for the logic to perform the programming. If the logic returns 1612 a "no fail" flag, page programming is completed 1615, and next page data may be programmed.

If the logic returns a "fail" status flag, the controller reads the counter 1667. A redirection address is computed 1668 and replaces the original address. The controller then attempt 1619 to program the user data at the redirected address. The controller then waits 1611' for the logic to perform the programming. If that process fails 1620, the cycle repeats until the page is successfully written 1621.

It should be noted that unlike successful programming 1615, success after failure 1621 requires testing if the redirected page is the first in the block, and if not—the preceding page(s) previously programmed in the (now bad) block need to be copied to the corresponding pages in the redirected block.

FIG. 16c schematically depicts part of the process performed by the controller 1112 after page programming has failed according to an exemplary embodiment of the current invention.

In the depicted example, several pages from a given block are addressed (page 0 to page 7). The process generally follows the page copying process 670 already depicted in FIGS. 7b, 8a and 8b. In this exemplary embodiment, it is not assumed that pages necessarily are sequentially written into a block. In this exemplary embodiment of copying pages already programmed into their destination block, all the pages in the defective block (not including the page that was redirected successfully in step 1611 if FIG. 16a) are preferably read and if contain user information—are copied into the redirection block. If during copying pages, a programming operation fail, the entire copying process has to repeat itself. Activation of the copying algorithm shown in FIG. 15c commence when a page programming in a block had failed and the information was successfully programmed into a redirected block.

In step 1650, the controller stores the current status in its memory. It associate the "original block" number to all the pages, except page number "failed page" which is associated with block number "redirected block". The controller set up a parameter PageX with the value of "failed page"; and a variable pageNum with the value "0". Variable pageNum will be used for cycling over all the pages in the block, one at a time, and (if needed) copying the information in them to the destination block. The controller starts the cycling of pageNum at value "0"; increasing the value 1659 by one, until all page numbers were cycled 1660.

First, the controller tests 1652 if pageNum equal to PageX. If so—the page in question has been already been successfully programmed into the destination block. If pageNum is other than pageNum, the page number pageNum is read 1656 from the block number associated with that page in the current status registered (in this case, "original block" was associated with all (but the failed page) in step 1650). Read information is optionally is checked ECC and corrected if needed. Read information is tested 1670, and if the page has no information (page native), it need not be copied to the destination page. If user information was read, the information is programmed 1611″ to their destination block. If the programming is successful, pageNum is increased 1659, and next pageNum is handled.

However, in some cases, page copying may fail 1691. In this case, the controller:

a) reads the counter 1691 and computes 1692 a "new redirection" block address and modify the "current status" created in step 1650 to associate the newly failed page number with the "new redirection" block address. Obviously, all pages need to be copied to this new redirected block address.

b) The parameter pageX is set to the page number of the recently failed page.

c) The variable pageNum is reset to "0".

Newly failed page is now programmed 1611‴ to the new redirection block. If programming fails 1683, a new redirection block is addressed. If the programming of the newly redirected page succeeds, cycling through all pages starts 1652 with pageNum equal to zero per 1691*c*. Yet, Since parameter PageX has been modified 1691*b*, the newly failed page need not be copied 1652; and since current status was modified 1691*a*, originally failed page will be read 1656 from the redirection block and copied 1611″ to the newly redirected block, while other pages will be read from original block to newly redirected block.

When coping is completed 1690, the controller updates the redirection table 400 by programming the newest redirection block number into the original block location in the table. Counter and redirection information table 400 are also updated during this copying process.

A modification to this algorithm may comprise using the controller volatile memory of holding information such as: failed block counter; redirection table; redirection information table; and user page information. Doing so assumes larger computing resources at the (preferably external) processor, but it decreases the programming and reading commands to the NVM. In some embodiments, redirection information table, and optionally or alternatively concise redirection table are stored at the controller's memory and programmed to the NVM after user's data has been completely programmed. In some of these cases, the NVM need not comprise a bit accessible area, as all information may be page programmed into the NVM.

The second class of embodiments according to the current invention depicted in FIGS. 11-16, enables faster access time during read operation; and simpler design of the NVM logic by using the extended FAM table 837 when addressing content loading applications where the data is loaded to the data storage devices at single sequence during the data storage assembly.

As program operation is conducted at the factory, an external controller may be used, being highly capable to conduct all task owned by the NVM logic. Yet, at the field, where only read operation is performed, a simple cost effective controller is assembled to the data storage device and used for the read operations.

Using the extended FAM, the average read latency may be reduced significantly—in contrast to embodiments wherein, the internal NVM logic first access the FAM dedicated bit. The bit indicates if the accessed block has been redirected and if true—the logic accesses the redirection table, which by being located in code region, may have a relatively long access time. According to embodiment of the current invention, when the controller has completed programming the NVM, it indicates it with a special access to the NVM logic. The concise table is then accessed and the addresses of the bad blocks and their redirection are marked in each row of the concise table, preferably in a sorted bad block address order.

When the controller access the NVM after the device has been programmed and locked, first—the logic reads the bit related to the block in the redirection indication table 813 in extended FAM 837. If the block has not been redirected, the logic proceeds with a regular read from the original address. Otherwise, the internal logic searches the concise redirection table 1210 in the extended FAM using search algorithm, for example, the known binary search algorithm (divide and conquer algorithm) to find the redirection address. Thus, the maximum number of access to the extended FAM, is log 2 [number of redirected pages]. Most of the pages are not redirected, and for these, the time overhead is only one cycle for the FAM read. In comparison, when a redirected page is accessed, the time overhead included an access to the redirected table which is relative longer.

For the above scenario, the NVM logic may be with basic functionality; the program operation begins with regular page program where the internal logic attempts to perform the programming operation. If the operation fails the status register will return a program fail indication. The external controller will read the counter page and calculate the new redirection address. The external controller will re-program the page into the redirection address. If the operation will fail again, the entire process will repeat itself.

Once the page is successfully programmed, the controller reads the additional pages from the original block and writes them one by one into the redirection address. If one of the pages fails programming the redirection process is repeated. Once the copying operation is done, the controller will update the extended FAM table including the redirection indication and concise tables. Note, in such an application redirection table is not needed.

According to the second class of embodiments of the invention, when performing a read operation the controller will access the continuous address space, and the logic will address the extended FAM, first to the redirection indication table, similarly as in the first class of embodiments of invention depicted in FIGS. 1-10, and if needed the redirection concise table is also addressed, in contrast to first class of embodiments of invention where the redirection table is addressed.

During the lifetime of the device, when the card is not fully programmed, the extended FAM is not functional completely but rather partially where the indication table 800 and redirection table are in use. Once the card is fully programmed, the redirection table become redundant and the extended FAM become fully functional and the concise redirection table is used.

In applications where no field programming is needed, the redirection table is redundant and can be removed.

As seen in FIGS. 14*a*-14*b* where the flow of concise table programming is described, there are two cases: the first is associated where the FAM 800 is written together with each block programming when redirection occurs while in the second case (as depicted in FIG. 14*b*) the FAM is programmed only once the memory is locked after all the user's data was programmed.

The above described invention may be modified to allow using data storage devices with program operation in field application, similarly to already disclosed second class of embodiments, and yet to enable faster access time during the most of the lifetime of the device after the card has been loaded to its full capacity and locked.

Under this circumstances, the complexity requirement from the controller and logic may be similar to that used in the first class of embodiments, or alternatively, allow somewhat simpler logic design and dual controllers types; a more complex data storage controller for content loading and simple read controller for field application.

A possible implementation of the above may be realized as follows;

The program operation begins with regular page program. The internal logic will attempt to perform the programming operation. If the operation fails, the status register will return a program fail indication. The internal logic will generate a new redirection address by reading the counter and holds it in a special register. The external controller will read the redirection address from the internal register and re-program the page into the redirection address; if the operation will fail again, the entire process will repeat itself. Once a page is successfully programmed, the controller reads the additional pages from the original block and writes them into the redirection address. If one of the pages has a program fail the redirection process will repeat itself.

To perform copying the already programmed pages associated with bad block, the controller will know where the good pages are located (current page in the redirected page and the other pages from the original address). Once the copying operation is completed, the controller will indicate to the NVM logic by writing the original and redirected address to special registers and performing a dummy program operation. The internal NVM logic will receive the originals and redirection addresses, and then update the redirection table.

The, the above modification may be suite to field application where the same controller serves for both program and read operations. In both cases, the extended FAM is used. The read operation is identical to the method described above except of the stage where the concise table is addressed—instead the redirection table is addressed.

To improve access time in this embodiment, the concise table rather than the redirection table may be when the data storage is loaded to its full capacity or alternatively locked. The logic then reads the whole redirect table and collects only the redirected blocks information, ignoring non-redirected block that do not keep any special information. Following that the logic writes the redirection concise table in the extended FAM. Each line in the concise redirection table holds the source address and its redirected one. The information at the extended FAM is preferably kept in a source address sorted It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub combination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A method of programming a Non Volatile Memories (NVM) having defective blocks comprising:
   assigning a replacement redirection block address for programming data intended to be programmed in said bad block wherein,
   assigning a replacement redirection block comprising:
      programming information in concise table within extended Fast Access Memory (FAM) table of the NVM.

2. The method of claim 1, and further comprising updating a counter with the number of bad blocks when encountering a bad block during programming.

3. The method of claim 2, wherein updating a counter comprises updating a single bit in a non volatile memory.

4. The method of claim 1, wherein the step of programming information in concise table within extended FAM section of the NVM comprising original and redirection addresses of said redirected blocks.

5. The method of claim 1, wherein the step of programming information in concise table within extended FAM section of the NVM is done after all user's data has been programmed to said NVM.

6. The method of claim 1, wherein the step of programming information in concise table within extended FAM section of the NVM is done after the NVM die is locked.

7. The method of claim 1, wherein said concise table comprising original and redirection addresses of said redirected blocks comprises a table sorted according to original block addresses.

8. The method of claim 7, wherein said concise table comprising multiple entries, wherein a single entry corresponding to at least a single bad block.

9. The method of claim 8, wherein concise table comprising multiple entries, single entry corresponding to a single bad block.

10. The method of claim 7, wherein said entry in said concise table consist at least 32 bits.

11. The method of claim 10, wherein said entry in said concise table consist 32 bits.

12. The method of claim 10, wherein said entry in said concise table consist 34 bits.

13. The method of claim 1, and further comprising updating redirection indication table in extended Fast Access Memory (FAM) table, indicating for each user data block logic address—if a replacement block was assigned or not.

14. The method of claim 13, wherein said redirection indication table in extended FAM table associates a single bit with at least single block in the user's data section.

15. The method of claim 13, wherein bits in said redirection indication table in extended FAM table are having index indicating the block address, and wherein the bit content indicates if the block has been redirected or not.

16. The method of claim 12, wherein updating redirection indication table in extended FAM table is done by changing a single bit.

17. The method of claim 1, wherein extended FAM is composed of fast accessed data capable of single bit accessibility.

18. The method of claim 1, wherein extended FAM is composed of fast accessed data with at least twice shorter word lines.

19. The method of claim 1, wherein extended FAM is composed of fast accessed data with at least twice the width of cells in data region within NVM array.

20. The method of claim 1, and further comprising:
(a) connecting a NVM die comprising:
user data section;
extended FAM section; and
management logic to a programming board comprising a programming controller;
(b) programming said NVM die with:
data in its user data section;
redirection concise table in its extended FAM section; and
redirection indication table in its extended FAM section;
(c) locking the NVM die;
(d) disconnecting said NVM die from said programming board;
(e) connecting said NVM die to a reading controller having less computing resources than said programming controller; and
(f) reading user information using said reading controller while presenting a continuous address space.

21. A method of reading user data page using embedded memory logic management in a continuous logical address space NVM, having several defective blocks, comprising:
(a) searching a concise redirection table located in extended Fast Access Memory (FAM) section for data indicative of actual address of redirected blocks;
(b) reading the directed block; and
(c) presenting continues address space to the host device.

22. The method of claim 21, and further comprising:
(a) reading from redirection indication table within extended FAM a data indicative if said logical address is associated with a redirected block; and
(b) if redirection indication table within extended FAM indicates that said logical address is associated with a redirected block—searching said concise redirection table data indicative of address of said redirected block.

23. The method of claim 21, and further comprising:
(a) reading indication register and determining if NVM die is locked or not; and
(b) if NVM die locked, accessing the concise redirection.

* * * * *